United States Patent
King et al.

(10) Patent No.: US 9,628,033 B2
(45) Date of Patent: Apr. 18, 2017

(54) POWER STAGE WITH SWITCHED MODE AMPLIFIER AND LINEAR AMPLIFIER

(71) Applicant: Cirrus Logic, Inc., Austin, TX (US)

(72) Inventors: Eric J. King, Dripping Springs, TX (US); Christophe J. Amadi, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/840,894

(22) Filed: Aug. 31, 2015

(65) Prior Publication Data

US 2016/0126908 A1  May 5, 2016

Related U.S. Application Data

(60) Provisional application No. 62/072,059, filed on Oct. 29, 2014, provisional application No. 62/090,142, filed on Dec. 10, 2014.

(51) Int. Cl.
*H03F 3/217* (2006.01)
*H03F 1/02* (2006.01)
(Continued)

(52) U.S. Cl.
CPC ......... *H03F 3/2178* (2013.01); *H03F 1/0277* (2013.01); *H03F 1/083* (2013.01);
(Continued)

(58) Field of Classification Search
CPC .... H03F 3/217; H03F 3/2178; H03F 2200/03; H03F 2200/231; H03F 3/2171;
(Continued)

(56) References Cited

U.S. PATENT DOCUMENTS

| 4,186,437 A | 1/1980 | Cuk |
| 5,077,539 A | 12/1991 | Howatt |

(Continued)

FOREIGN PATENT DOCUMENTS

| DE | 10126236 A1 | 12/2002 |
| EP | 1374394 A2 | 1/2004 |

(Continued)

OTHER PUBLICATIONS

Combined Search and Examination Report, GB Application No. GB1518256.1, Apr. 15, 2016, 4 pages.

(Continued)

*Primary Examiner* — Khanh V Nguyen
(74) *Attorney, Agent, or Firm* — Jackson Walker L.L.P.

(57) ABSTRACT

A method for producing an output voltage to a load may include, in a power stage comprising power converter having a power inductor, a plurality of switches arranged to sequentially operate in a plurality of switch configurations, and an output for producing the output voltage comprising a first output terminal and a second output terminal, controlling the linear amplifier to transfer electrical energy from the input source of the power stage to the load in accordance with one or more least significant bits of a digital input signal, and controlling the power converter in accordance with bits of the digital input signal other than the one or more least significant bits to sequentially apply switch configurations from the plurality of switch configurations to selectively activate or deactivate each of the plurality of switches in order to transfer electrical energy from the input source of the power stage to the load.

18 Claims, 15 Drawing Sheets

(51) Int. Cl.
*H03F 1/08* (2006.01)
*H03F 3/181* (2006.01)

(52) U.S. Cl.
CPC ........... *H03F 3/181* (2013.01); *H03F 3/2171* (2013.01); *H03F 3/217* (2013.01); *H03F 3/2173* (2013.01); *H03F 2200/03* (2013.01); *H03F 2200/231* (2013.01)

(58) Field of Classification Search
CPC ........ H03F 1/083; H03F 3/181; H03F 1/0277; H03F 2200/432; H03F 3/2173
USPC ....................................................... 330/251
See application file for complete search history.

(56) References Cited

U.S. PATENT DOCUMENTS

| | | |
|---|---|---|
| 5,216,379 A | 6/1993 | Hamley |
| 5,231,360 A | 7/1993 | Storey |
| 5,442,317 A | 8/1995 | Stengel |
| 5,907,235 A | 5/1999 | Blumenkrantz et al. |
| 6,060,950 A | 5/2000 | Groe |
| 6,150,798 A | 11/2000 | Ferry et al. |
| 6,166,527 A | 12/2000 | Dwelley et al. |
| 6,348,781 B1 | 2/2002 | Midya et al. |
| 6,661,285 B1 * | 12/2003 | Pompei ................. H03F 3/2178 330/251 |
| 7,129,680 B2 | 10/2006 | Higashitani et al. |
| 7,176,667 B2 | 2/2007 | Chen et al. |
| 7,265,524 B2 | 9/2007 | Jordan et al. |
| 7,298,119 B1 | 11/2007 | Amram Summit et al. |
| 7,391,190 B1 | 6/2008 | Rajagopalan |
| 7,495,419 B1 | 2/2009 | Ju |
| 7,499,557 B1 | 3/2009 | Yang et al. |
| 7,863,841 B2 | 1/2011 | Menegoli et al. |
| 7,863,872 B2 | 5/2011 | Lopata et al. |
| 7,952,900 B2 | 5/2011 | Tomiyoshi et al. |
| 8,143,945 B2 * | 3/2012 | Jurzitza ................... H03F 3/217 330/207 A |
| 8,228,118 B1 * | 7/2012 | Hsieh ..................... H03F 1/342 330/251 |
| 8,232,787 B2 | 7/2012 | De Cremoux |
| 8,269,471 B2 | 9/2012 | Singnurkar |
| 8,269,472 B2 | 9/2012 | Lin |
| 8,415,937 B2 | 4/2013 | Hester |
| 8,637,909 B1 | 1/2014 | Vorhaus |
| 8,638,168 B1 | 1/2014 | Signoff et al. |
| 8,860,387 B2 | 10/2014 | Kobayashi |
| 9,077,206 B2 | 7/2015 | Zhang et al. |
| 9,088,211 B2 | 7/2015 | Ivanov et al. |
| 9,287,781 B2 | 3/2016 | Wilson |
| 2001/0040521 A1 | 11/2001 | Albinet et al. |
| 2002/0167354 A1 | 11/2002 | Stanley |
| 2002/0171475 A1 | 11/2002 | Picha et al. |
| 2004/0135562 A1 | 7/2004 | Oden |
| 2004/0239299 A1 | 12/2004 | Vinciarelli |
| 2007/0018719 A1 | 1/2007 | Seven |
| 2007/0057720 A1 | 3/2007 | Hand et al. |
| 2007/0279024 A1 | 12/2007 | Falvey |
| 2008/0012639 A1 | 1/2008 | Mels |
| 2008/0055946 A1 | 3/2008 | Lesso et al. |
| 2008/0164766 A1 | 7/2008 | Adest et al. |
| 2008/0310046 A1 | 12/2008 | Menegoli et al. |
| 2009/0146623 A1 | 6/2009 | De Cremoux et al. |
| 2010/0019844 A1 | 1/2010 | Metzger et al. |
| 2010/0039080 A1 | 2/2010 | Schoenbauer et al. |
| 2010/0157638 A1 | 6/2010 | Naiknaware et al. |
| 2010/0194359 A1 | 8/2010 | Notman |
| 2011/0050349 A1 | 3/2011 | Strickland et al. |
| 2011/0101948 A1 | 5/2011 | Lopata et al. |
| 2011/0222326 A1 | 9/2011 | Gray et al. |
| 2011/0228945 A1 | 9/2011 | Mihelich et al. |
| 2012/0049816 A1 | 3/2012 | Hester |
| 2012/0262142 A1 | 10/2012 | Chen et al. |
| 2012/0319669 A1 | 12/2012 | Chen et al. |
| 2013/0082771 A1 | 4/2013 | Delano |
| 2013/0121512 A1 | 5/2013 | Chen |
| 2013/0207731 A1 | 8/2013 | Balteanu |
| 2013/0249523 A1 | 9/2013 | Knott et al. |
| 2013/0293204 A1 | 11/2013 | Lu |
| 2014/0210437 A1 | 7/2014 | Chen |
| 2015/0030183 A1 | 1/2015 | Pazhayaveetil et al. |
| 2015/0032396 A1 | 1/2015 | Pazhayaveetil et al. |
| 2015/0123627 A1 | 5/2015 | Veeramreddi et al. |
| 2015/0222184 A1 | 8/2015 | Melanson et al. |
| 2015/0222185 A1 | 8/2015 | King et al. |
| 2015/0222235 A1 | 8/2015 | Swanson et al. |
| 2015/0323947 A1 | 11/2015 | Amadi et al. |
| 2015/0326125 A1 | 11/2015 | King et al. |
| 2015/0326126 A1 | 11/2015 | King et al. |
| 2015/0326187 A1 | 11/2015 | Maru et al. |
| 2016/0126908 A1 | 5/2016 | King et al. |

FOREIGN PATENT DOCUMENTS

| | | |
|---|---|---|
| EP | 1432120 A1 | 6/2004 |
| EP | 2096752 A1 | 9/2009 |
| EP | 2395657 A1 | 12/2011 |
| EP | 2432119 A1 | 3/2012 |
| EP | 2587665 A1 | 5/2013 |
| EP | 2709272 A1 | 3/2014 |
| EP | 2768136 A1 | 8/2014 |
| GB | 2533994 A | 7/2016 |
| JP | 2008289047 A | 11/2008 |
| WO | 2011019588 A1 | 2/2011 |
| WO | 2015119956 A2 | 8/2015 |
| WO | 2015119958 A1 | 8/2015 |
| WO | 2015119961 A1 | 8/2015 |
| WO | 2015171931 A1 | 11/2015 |
| WO | 2015171935 A1 | 11/2015 |
| WO | 2015171937 A1 | 11/2015 |
| WO | 2015171940 A1 | 11/2015 |
| WO | 2016069366 A2 | 5/2016 |

OTHER PUBLICATIONS

International Search Report and Written Opinion, International Application No. PCT/US2015/056846, mailed Apr. 22, 2016, 20 pages.
International Search Report and Written Opinion, App. No. PCT/US2015/0014274, mailed Aug. 24, 2015, 20 pages.
International Search Report and Written Opinion, App. No. PCT/US2015/029747, mailed Sep. 17, 2015, 13 pages.
Himmelstoss, F.A., et al., Compensated Class-D Amplifier as High Quality AC-Voltage Source, Power Electronics and Drive Systems, 1999, PEDS '99 Proceedings of the IEEE 1999 International Conference, Jul. 27-29, 1999, Piscataway, JN, USA, IEEE vol. 1, Jul. 27, 1999, pp. 116-120.
International Search Report and Written Opinion of the International Searching Authority, International Application No. PCT/US2015/014292, mailed Apr. 22, 2015, 11 pages.
Van Der Zee, R.A.R. et al., A Power Efficient Audio Amplifier Combining Switching and Linear Techniques, Proceedings of the 24th European Solid-State Circuits Conference, 1998, ESSCIRC '98, pp. 288-291.
International Search Report and Written Opinion, App. No. PCT/US2015/014282, mailed Jul. 9, 2015, 18 pages.
International Search Report and Written Opinion, App. No. PCT/US2015/029765, mailed Aug. 19, 2015, 11 pages.
International Search Report and Written Opinion, App. No. PCT/US2015/029753, mailed Aug. 20, 2015, 10 pages.
International Search Report and Written Opinion, App. No. PCT/US2015/029761, mailed Aug. 20, 2015, 11 pages.

* cited by examiner

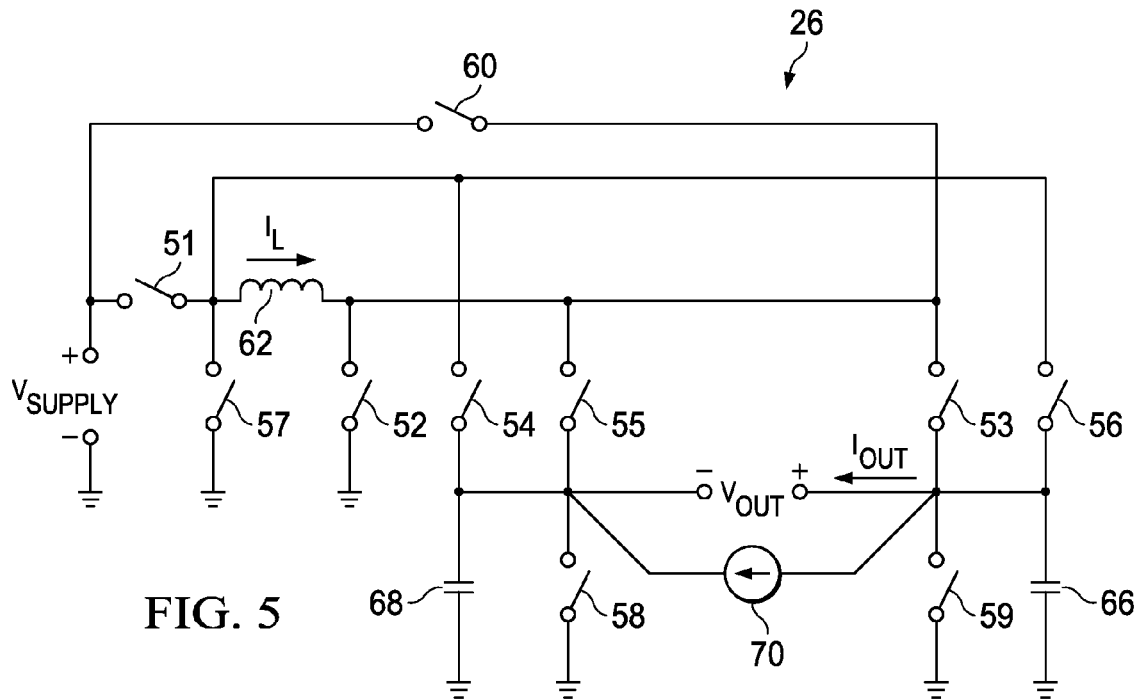
FIG. 5
| $V_{OUT}$ | PHASE | SWITCH STATES | | | | | | | | | |
|---|---|---|---|---|---|---|---|---|---|---|---|
| +/- | T1/T2 | 51 | 52 | 53 | 54 | 55 | 56 | 57 | 58 | 59 | 60 |
| + | T1 | 1 | 1 | 0 | 0 | 0 | 0 | 0 | 1 | 0 | 0 |
| + | T2 | 1 | 0 | 1 | 0 | 0 | 0 | 0 | 1 | 0 | 0 |
| - | T1 | 1 | 1 | 0 | 0 | 0 | 0 | 0 | 0 | 1 | 0 |
| - | T2 | 1 | 0 | 0 | 0 | 1 | 0 | 0 | 0 | 1 | 0 |
FIG. 6
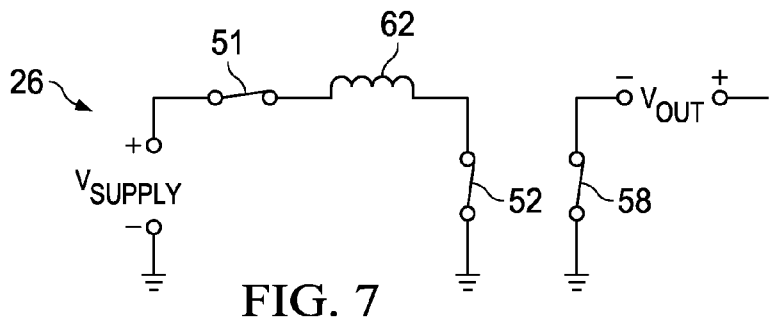
FIG. 7

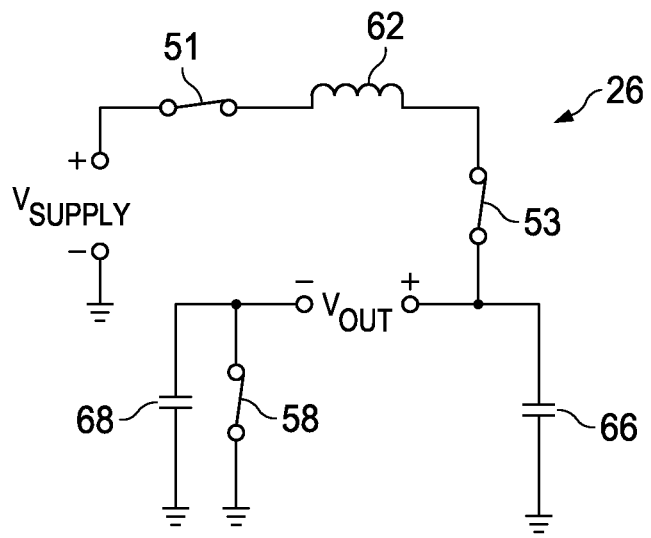
FIG. 8
| $V_{OUT}$ | PHASE | SWITCH STATES | | | | | | | | | |
|---|---|---|---|---|---|---|---|---|---|---|---|
| +/- | T1/T2 | 51 | 52 | 53 | 54 | 55 | 56 | 57 | 58 | 59 | 60 |
| + | T1 | 1 | 1 | 0 | 0 | 0 | 0 | 0 | 0 | 0 | 0 |
| + | T2 | 0 | 0 | 1 | 1 | 0 | 0 | 0 | 0 | 0 | 0 |
| - | T1 | 1 | 1 | 0 | 0 | 0 | 0 | 0 | 0 | 0 | 0 |
| - | T2 | 0 | 0 | 0 | 0 | 1 | 1 | 0 | 0 | 0 | 0 |
FIG. 9
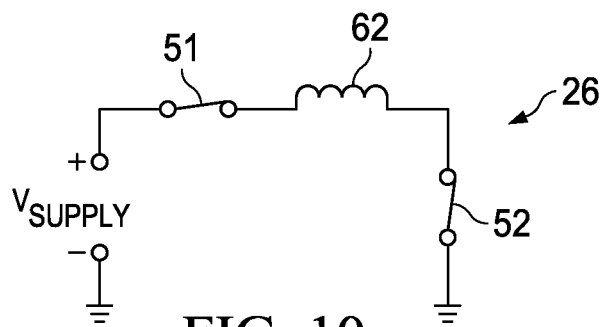
FIG. 10

| V<sub>OUT</sub> | CM | PHASE | SWITCH STATES | | | | | | | | | |
|---|---|---|---|---|---|---|---|---|---|---|---|---|
| +/- | +/- | T1/T2 | 51 | 52 | 53 | 54 | 55 | 56 | 57 | 58 | 59 | 60 |
| + | + | T1 | 1 | 0 | 1 | 0 | 0 | 0 | 0 | 0 | 0 | 0 |
| + | + | T2 | 0 | 0 | 1 | 1 | 0 | 0 | 0 | 0 | 0 | 0 |
| + | - | T1 | 0 | 1 | 0 | 1 | 0 | 0 | 0 | 0 | 0 | 0 |
| + | - | T2 | 0 | 0 | 1 | 1 | 0 | 0 | 0 | 0 | 0 | 0 |
| - | + | T1 | 1 | 0 | 0 | 0 | 1 | 0 | 0 | 0 | 0 | 0 |
| - | + | T2 | 0 | 0 | 0 | 0 | 1 | 1 | 0 | 0 | 0 | 0 |
| - | - | T1 | 0 | 1 | 0 | 0 | 0 | 1 | 0 | 0 | 0 | 0 |
| - | - | T2 | 0 | 0 | 0 | 0 | 1 | 1 | 0 | 0 | 0 | 0 |

| $V_{TGT}$ | $V_{OUT}$ | CM | PHASE | SWITCH STATES | | | | | | | | | |
|---|---|---|---|---|---|---|---|---|---|---|---|---|---|
| +/− | +/− | +/− | T1/T2 | 51 | 52 | 53 | 54 | 55 | 56 | 57 | 58 | 59 | 60 |
| + | − | + | T1 | 1 | 0 | 1 | 0 | 0 | 0 | 0 | 0 | 0 | 0 |
| + | − | + | T2 | 0 | 0 | 1 | 0 | 0 | 0 | 1 | 0 | 0 | 0 |
| + | − | − | T1 | 0 | 1 | 0 | 1 | 0 | 0 | 0 | 0 | 0 | 0 |
| + | − | − | T2 | 0 | 0 | 1 | 0 | 0 | 0 | 1 | 0 | 0 | 0 |
| − | + | + | T1 | 1 | 0 | 0 | 0 | 1 | 0 | 0 | 0 | 0 | 0 |
| − | + | + | T2 | 0 | 0 | 0 | 0 | 1 | 0 | 1 | 0 | 0 | 0 |
| − | + | − | T1 | 0 | 1 | 0 | 0 | 0 | 1 | 0 | 0 | 0 | 0 |
| − | + | − | T2 | 0 | 0 | 0 | 0 | 1 | 0 | 1 | 0 | 0 | 0 |
FIG. 16
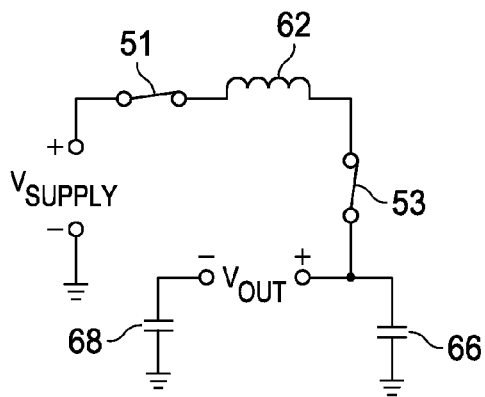
FIG. 17
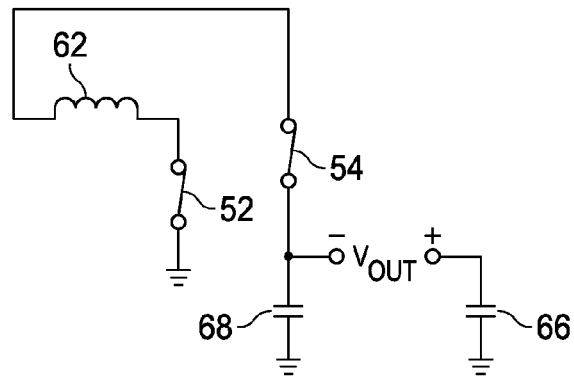
FIG. 18
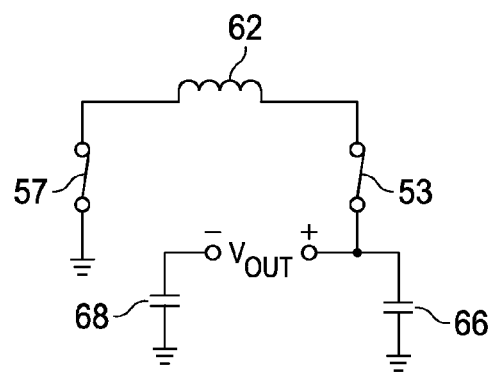
FIG. 19

| $V_{TGT}$ | CM | PHASE | SWITCH STATES | | | | | | | | | |
|---|---|---|---|---|---|---|---|---|---|---|---|---|
| +/- | +/- | T1/T2 | 51 | 52 | 53 | 54 | 55 | 56 | 57 | 58 | 59 | 60 |
| + | + | T1 | 1 | 0 | 1 | 0 | 0 | 0 | 0 | 0 | 0 | 0 |
| | | T2 | 0 | 0 | 0 | 1 | 0 | 0 | 0 | 0 | 0 | 1 |
| + | - | T1 | 0 | 1 | 0 | 1 | 0 | 0 | 0 | 0 | 0 | 0 |
| | | T2 | 0 | 0 | 1 | 0 | 0 | 0 | 1 | 0 | 0 | 0 |
| - | + | T1 | 1 | 0 | 0 | 0 | 1 | 0 | 0 | 0 | 0 | 0 |
| | | T2 | 0 | 0 | 0 | 0 | 0 | 1 | 0 | 0 | 0 | 1 |
| - | - | T1 | 0 | 1 | 0 | 0 | 0 | 1 | 0 | 0 | 0 | 0 |
| | | T2 | 0 | 0 | 0 | 0 | 1 | 0 | 1 | 0 | 0 | 0 |
FIG. 20
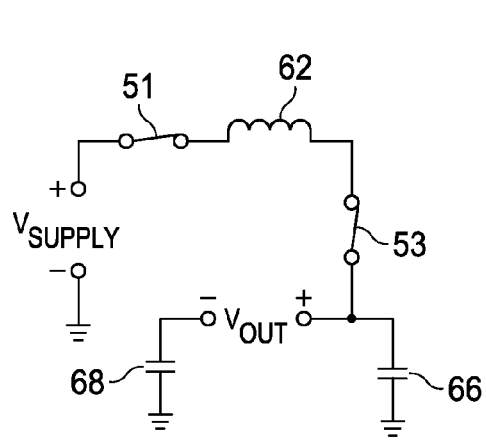
FIG. 21
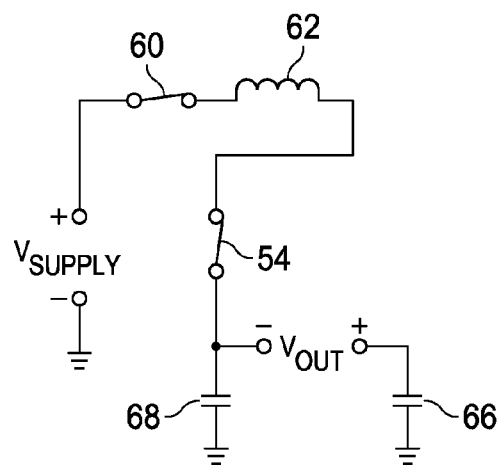
FIG. 22
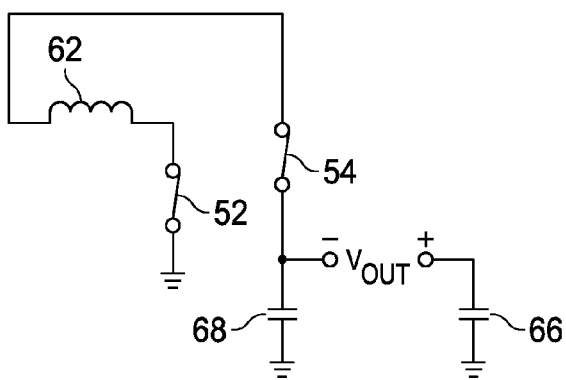
FIG. 23
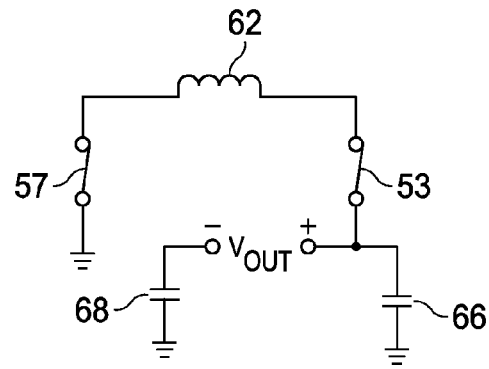
FIG. 24

POWER STAGE WITH SWITCHED MODE AMPLIFIER AND LINEAR AMPLIFIER

RELATED APPLICATIONS

The present disclosure claims priority to U.S. Provisional Patent Application Ser. No. 62/072,059, filed Oct. 29, 2014, and U.S. Provisional Patent Application Ser. No. 62/090,142, filed Dec. 10, 2014, each of which is incorporated by reference herein in its entirety.

The present disclosure is related to U.S. application Ser. No. 14/612,889 filed Feb. 3, 2015, U.S. application Ser. No. 14/612,946 filed Feb. 3, 2015, U.S. application Ser. No. 14/612,734 filed Feb. 3, 2015, U.S. application Ser. No. 14/706,587 filed May 7, 2015, U.S. application Ser. No. 14/706,624 filed May 7, 2015, U.S. application Ser. No. 14/706,656 filed May 7, 2015, and U.S. application Ser. No. 14/706,680 filed May 7, 2015, each of which is incorporated by reference herein in its entirety.

FIELD OF DISCLOSURE

The present disclosure relates in general to circuits for audio devices, including without limitation personal audio devices such as wireless telephones and media players, and more specifically, to a power stage with a switch mode amplifier and a linear amplifier mode for driving an audio transducer of an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

One existing approach to driving an audio output signal is to employ a speaker driver, such as speaker driver 100 depicted in FIG. 1. Speaker driver 100 may include an envelope-tracking boost converter 102 (e.g., a Class H amplifier) followed by a full-bridge output stage 104 (e.g., a Class D amplifier) which effectively operates as another converter stage. Boost converter 102 may include a power inductor 104, switches 106, 108, and a capacitor 110 arranged as shown. Full-bridge output stage 104 may include switches 112, 114, 116, and 118, inductors 120 and 124, and capacitors 122 and 126 as shown.

Speaker drivers such as speaker driver 100 suffer from numerous disadvantages. One disadvantage is that due to switching in output stage 104, such a speaker driver 100 may give rise to large amounts of radiated electromagnetic radiation, which may cause interference with other electromagnetic signals. Such radiated electromagnetic interference may be mitigated by LC filters formed using inductor 120 and capacitor 122 and inductor 124 and capacitor 126. However, such LC filters are often quite large in size, and coupling capacitors 122 and 124 to the terminals of the output transducer may have a negative impact on the power efficiency of speaker driver 100.

In addition, such architectures often do not handle large impulsive signals. To reduce power consumption, a power supply voltage $V_{SUPPLY}$ may be varied in accordance with the output signal, such that $V_{SUPPLY}$ may operate at lower voltage levels for lower output signal magnitudes. Thus, if a signal quickly increases, adequate time may not be present to increase voltage $V_{SUPPLY}$, thus leading to signal clipping unless a delay is placed in the signal path. However, adding a delay to a signal path may cause incompatibility with other types of audio circuits, such as adaptive noise cancellation circuits.

SUMMARY

In accordance with the teachings of the present disclosure, one or more disadvantages and problems associated with existing approaches to driving an audio output signal to an audio transducer may be reduced or eliminated.

In accordance with embodiments of the present disclosure, a power stage for producing an output voltage to a load may include a power converter, a linear amplifier, and a controller. The power converter may include a plurality of switches arranged to sequentially operate in a plurality of switch configurations and an output for producing the output voltage comprising a first output terminal and a second output terminal, wherein a first switch of the plurality of switches is coupled to the first output terminal and a second switch of the plurality of switches is coupled to the second output terminal. The linear amplifier may be coupled to the output. The controller may be configured to: (i) in a first mode of operation of the power stage, enable the linear amplifier to transfer electrical energy from an input source of the power stage to the load and disable the plurality of switches from transferring electrical energy from the input source to the load; and (ii) in a second mode of operation of the power stage, sequentially enable the linear amplifier in accordance with a probability which is a function of the output voltage to transfer electrical energy from the input source of the power stage to the load and sequentially apply switch configurations from the plurality of switch configurations to selectively activate or deactivate each of the plurality of switches in order to transfer electrical energy from the input source of the power stage to the load.

In accordance with these and other embodiments of the present disclosure, a power stage for producing an output voltage to a load may include a power converter, a linear amplifier, and a controller. The power converter may include a plurality of switches arranged to sequentially operate in a plurality of switch configurations and an output for producing the output voltage comprising a first output terminal and a second output terminal, wherein a first switch of the plurality of switches is coupled to the first output terminal and a second switch of the plurality of switches is coupled to the second output terminal. The linear amplifier may be coupled to the output. The controller may be configured to control the linear amplifier to transfer electrical energy from the input source of the power stage to the load in accordance with one or more least significant bits of a digital input signal control the power converter in accordance with bits of the digital input signal other than the one or more least significant bits to sequentially apply switch configurations from the plurality of switch configurations to selectively activate or deactivate each of the plurality of switches in order to transfer electrical energy from the input source of the power stage to the load.

In accordance with these and other embodiments of the present disclosure, a method for producing an output voltage to a load may include, in a power stage comprising a power converter having a power inductor, a plurality of switches arranged to sequentially operate in a plurality of switch configurations, and an output for producing the output voltage comprising a first output terminal and a second output terminal, wherein a first switch of the plurality of switches is coupled to the first output terminal and a second switch of the plurality of switches is coupled to the second output terminal: (i) in a first mode of operation of the power stage, enable a linear amplifier to transfer electrical energy from an input source of the power stage to the load and disable the plurality of switches from transferring electrical energy from the input source to the load; and (ii) in a second mode of operation of the power stage, sequentially enable the linear amplifier in accordance with a probability which is a function of the output voltage to transfer electrical energy from the input source of the power stage to the load and sequentially apply switch configurations from the plurality of switch configurations to selectively activate or deactivate each of the plurality of switches in order to transfer electrical energy from the input source of the power stage to the load.

In accordance with these and other embodiments of the present disclosure, a method for producing an output voltage to a load may include, in a power stage comprising a power converter having a power inductor, a plurality of switches arranged to sequentially operate in a plurality of switch configurations, and an output for producing the output voltage comprising a first output terminal and a second output terminal, wherein a first switch of the plurality of switches is coupled to the first output terminal and a second switch of the plurality of switches is coupled to the second output terminal: (i) controlling the linear amplifier to transfer electrical energy from the input source of the power stage to the load in accordance with one or more least significant bits of a digital input signal; and (ii) controlling the power converter in accordance with bits of the digital input signal other than the one or more least significant bits to sequentially apply switch configurations from the plurality of switch configurations to selectively activate or deactivate each of the plurality of switches in order to transfer electrical energy from the input source of the power stage to the load.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 5 illustrates a circuit diagram of selected components of another example power converter, in accordance with embodiments of the present disclosure;

FIG. 6 illustrates a table setting forth switch configurations of the power converter of FIG. 5 when operating in a single-ended boost mode, in accordance with embodiments of the present disclosure;

FIG. 7 illustrates an equivalent circuit diagram of selected components of the power converter of FIG. 5 operating in a charging phase of a single-ended boost mode, in accordance with embodiments of the present disclosure;

FIG. 8 illustrates an equivalent circuit diagram of selected components of the power converter of FIG. 5 operating in a discharge phase of a single-ended boost mode, in accordance with embodiments of the present disclosure;

FIG. 9 illustrates a table setting forth switch configurations of the power converter of FIG. 5 when operating in a differential-output buck-boost mode, in accordance with embodiments of the present disclosure;

FIG. 10 illustrates an equivalent circuit diagram of selected components of the power converter of FIG. 5 operating in a charging phase of a differential-output buck-boost mode, in accordance with embodiments of the present disclosure;

FIG. 16 illustrates a table setting forth switch configurations of the power converter of FIG. 5 when operating in a turn-around mode, in accordance with embodiments of the present disclosure;

FIG. 17 illustrates an equivalent circuit diagram of selected components of the power converter of FIG. 5 operating in a charging phase of a differential-output turn-around mode, in accordance with embodiments of the present disclosure;

FIG. 18 illustrates an equivalent circuit diagram of selected components of the power converter of FIG. 5 operating in another charging phase of a differential-output turn-around mode, in accordance with embodiments of the present disclosure;

FIG. 19 illustrates an equivalent circuit diagram of selected components of the power converter of FIG. 5 operating in a discharge phase of a differential-output turn-around mode, in accordance with embodiments of the present disclosure;

FIG. 20 illustrates a table setting forth switch configurations of the power converter of FIG. 5 when operating in a single-ended buck mode, in accordance with embodiments of the present disclosure;

FIG. 21 illustrates an equivalent circuit diagram of selected components of the power converter of FIG. 5 operating in a charging phase of a single-ended buck mode, in accordance with embodiments of the present disclosure;

FIG. 22 illustrates an equivalent circuit diagram of selected components of the power converter of FIG. 5 operating in a discharge phase of a single-ended buck mode, in accordance with embodiments of the present disclosure;

FIG. 23 illustrates an equivalent circuit diagram of selected components of the power converter of FIG. 5 operating in another charging phase of a single-ended buck mode, in accordance with embodiments of the present disclosure;

FIG. 24 illustrates an equivalent circuit diagram of selected components of the power converter of FIG. 5 operating in another discharge phase of a single-ended buck mode, in accordance with embodiments of the present disclosure;

DETAILED DESCRIPTION

Figure 1:
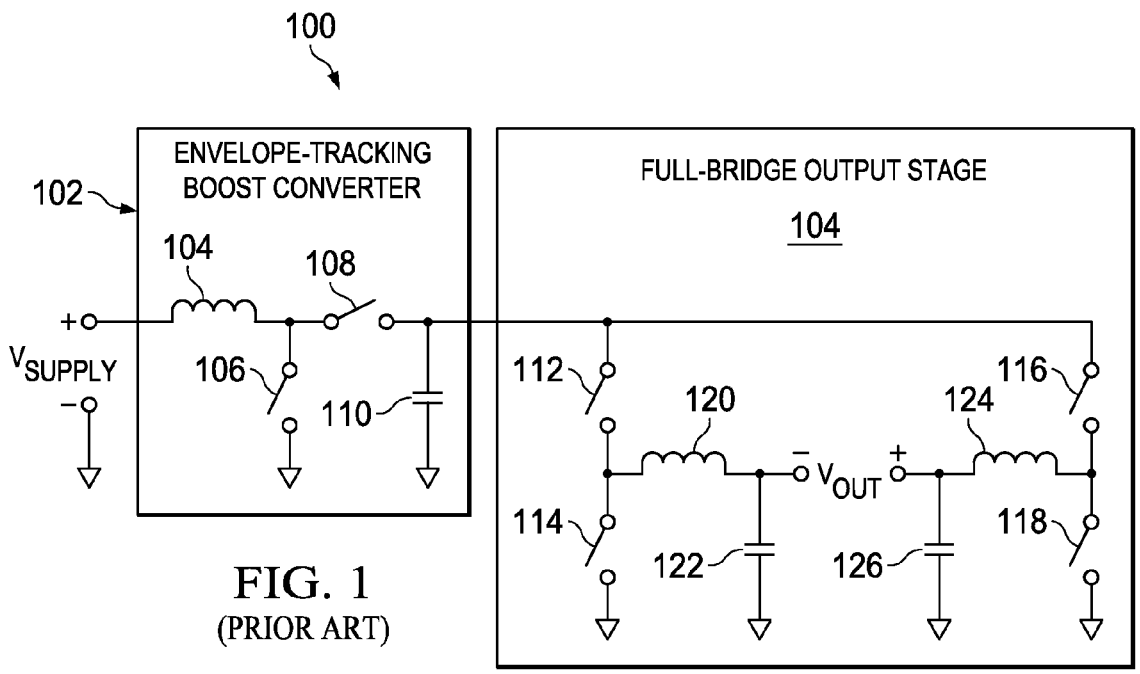
FIG. 1 illustrates an example speaker driver, as is known in the relevant art.
Figure 2:
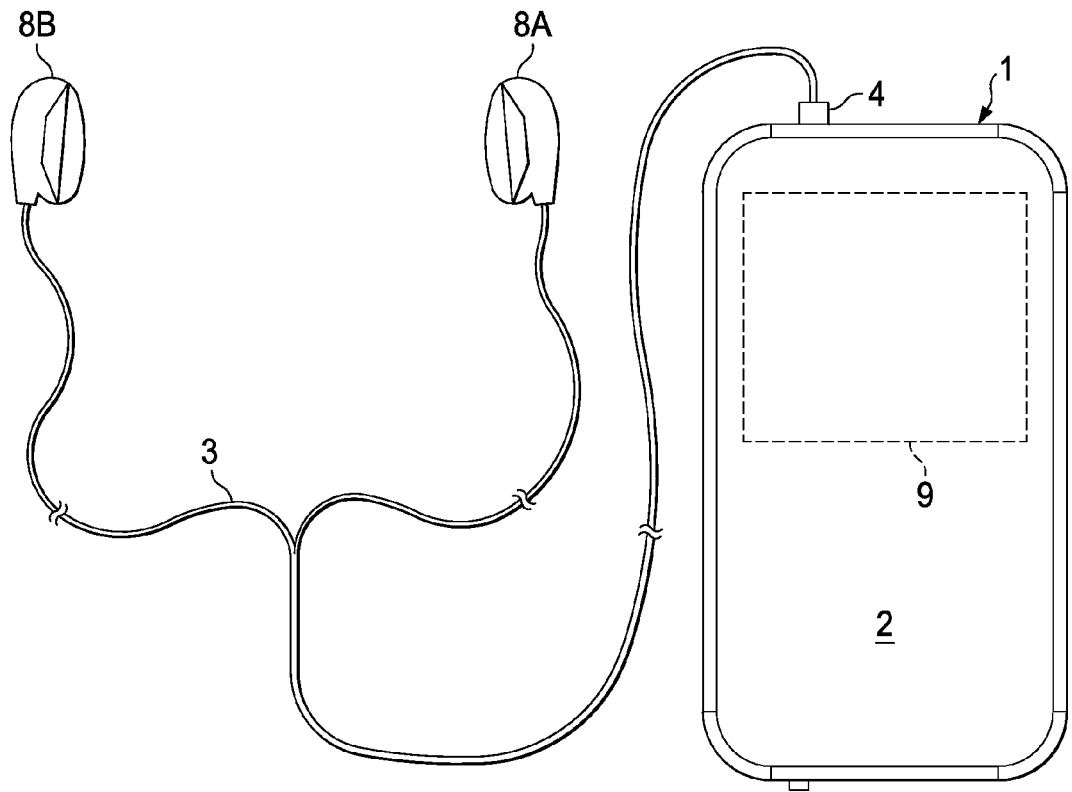
FIG. 2 illustrates an example personal audio device, in accordance with embodiments of the present disclosure.

FIG. 2 illustrates an example personal audio device 1, in accordance with embodiments of the present disclosure. FIG. 2 depicts personal audio device 1 coupled to a headset 3 in the form of a pair of earbud speakers 8A and 8B. Headset 3 depicted in FIG. 2 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 2, personal audio device 1 may include an audio integrated circuit (IC) 9 for generating an analog audio signal for transmission to headset 3 and/or another audio transducer.

Figure 3:
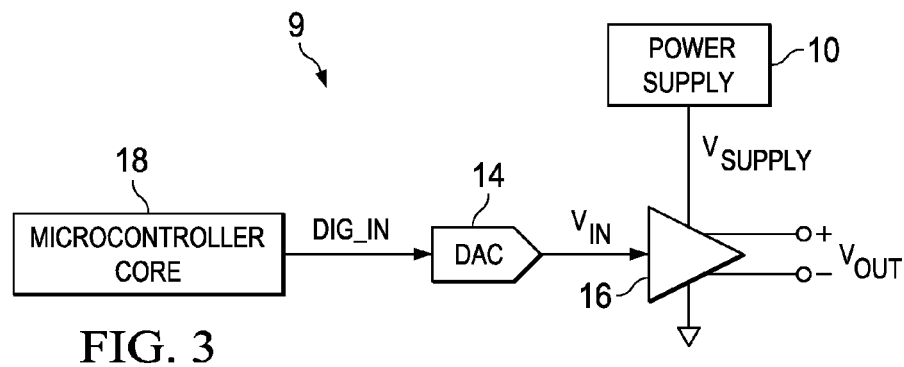
FIG. 3 illustrates a block diagram of selected components of an example audio integrated circuit of a personal audio device, in accordance with embodiments of the present disclosure.

FIG. 3 illustrates a block diagram of selected components of an example audio IC 9 of a personal audio device, in accordance with embodiments of the present disclosure. As shown in FIG. 3, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a battery. Although FIGS. 2 and 3 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 4:
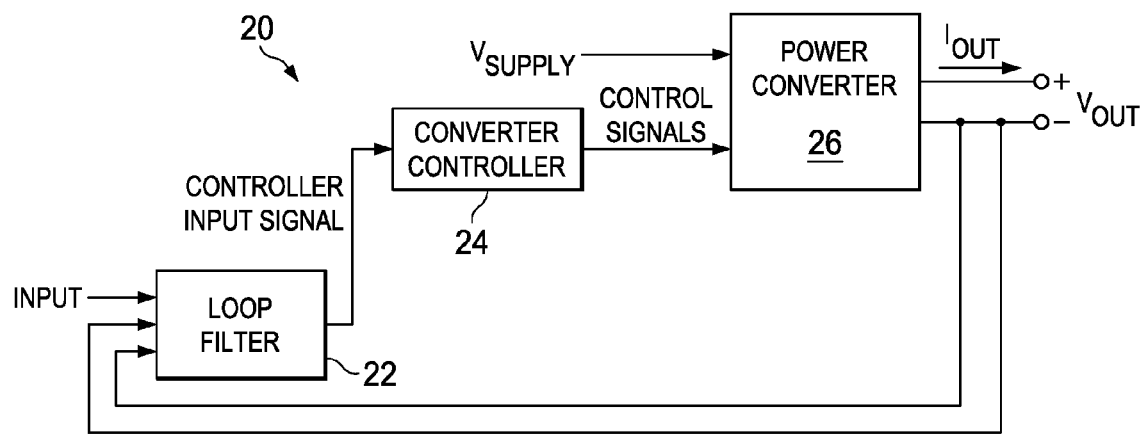
FIG. 4 illustrates a block and circuit diagram of selected components of an example switched mode amplifier, in accordance with embodiments of the present disclosure.

FIG. 4 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 3. As shown in FIG. 4, switched mode amplifier 20 may comprise a loop filter 22, a converter controller 24, and a power converter 26.

Loop filter 22 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a controller input signal to be communicated to converter controller 24. In some embodiments, such controller input signal may comprise a signal indicative of an integrated error between the input signal and the feedback signal, as is described in greater detail below with reference to FIGS. 6, 9 and 25. In other embodiments, such controller input signal may comprise a signal indicative of a target current signal to be driven as an output current $I_{OUT}$ to a load coupled to the output terminals of power converter 26, as described in greater detail below with reference to FIGS. 26 and 27.

Converter controller 24 may comprise any system, device, or apparatus configured to, based on the controller input signal, sequentially select among operational modes of power converter 26 and based on a selected operational mode, communicate a plurality of control signals to power converter 26 to apply a switch configuration from a plurality of switch configurations of switches of power converter 26 to selectively activate or deactivate each of the plurality of switches in order to transfer electrical energy from a power supply $V_{SUPPLY}$ to the load of switched-mode amplifier 20 in accordance with the selected operational mode. Examples of operational modes and switch configurations associated with each are described in greater detail elsewhere in this disclosure. Example implementations of converter controller 24 are also described in greater detail elsewhere in this disclosure. In addition, in some embodiments, converter controller 24 may control switches of a power converter 26 in order to regulate a common mode voltage of the output terminals of power converter 26 to the maximum of a first voltage associated with switched-mode amplifier 20 and a second voltage associated with switched-mode amplifier 20. In some embodiments, the first voltage may comprise one-half of the supply voltage $V_{SUPPLY}$. In these and other embodiments, the second voltage may comprise one-half of output voltage $V_{OUT}$, or another signal indicative of an expected voltage for output voltage $V_{OUT}$ (e.g., input voltage signal $V_{IN}$).

Power converter 26 may receive at its input a voltage $V_{SUPPLY}$ (e.g., provided by power supply 10) at its input, and may generate at its output audio output signal $V_{OUT}$. Although not explicitly shown in FIG. 3, in some embodiments, voltage $V_{SUPPLY}$ may be received via input terminals including a positive input terminal and a negative input terminal which may be coupled to a ground voltage. As described in greater detail in this disclosure, power converter 26 may comprise a power inductor and a plurality of switches that are controlled by control signals received from converter controller 24 in order to convert voltage $V_{SUPPLY}$ to audio output signal $V_{OUT}$, such that audio output signal $V_{OUT}$ is a function of the input signal to loop filter 22. Examples of power converter 26 are described in greater detail elsewhere in this disclosure.

FIG. 5 illustrates a circuit diagram of selected components of an example power converter 26, in accordance with embodiments of the present disclosure. In some embodiments, power converter 26 depicted in FIG. 5 may implement all or a portion of power converter 26 described with respect to FIG. 4. As shown in FIG. 5, power converter 26 may receive at its input a voltage $V_{SUPPLY}$ (e.g., provided by power supply 10) at input terminals, including a positive input terminal and a negative input terminal which may be coupled to a ground voltage, and may generate at its output a differential output voltage $V_{OUT}$. Power converter 26 may comprise a power inductor 62 and plurality of switches 51-60. Power inductor 62 may comprise any passive two-terminal electrical component which resists changes in electrical current passing through it and such that when electrical current flowing through it changes, a time-varying magnetic field induces a voltage in power inductor 62, in accordance with Faraday's law of electromagnetic induction, which opposes the change in current that created the magnetic field.

Each switch 51-60 may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 51-60 (e.g., control signals communicated from converter controller 24) are not depicted although such control signals would be present to selectively enable and disable switches 51-60. In some embodiments, a switch 51-60 may comprise an n-type metal-oxide-semiconductor field-effect transistor. Switch 51 may be coupled between the positive input terminal and a first terminal of power inductor 62. Switch 52 may be coupled between a second terminal of power inductor 62 and ground. Switch 53 may be coupled between a positive terminal of the output of power converter 26 and a second terminal of power inductor 62. Switch 54 may be coupled between a negative terminal of the output of power converter 26 and the first terminal of power inductor 62. Switch 55 may be coupled between a negative terminal of the output of power converter 26 and the second terminal of power inductor 62. Switch 56 may be coupled between a positive terminal of the output of power converter 26 and the first terminal of power inductor 62. Switch 57 may be coupled between the ground voltage and the first terminal of power inductor 62. Switch 58 may be coupled between the negative terminal of the output of power converter 26 and the ground voltage. Switch 59 may be coupled between the positive terminal of the output of power converter 26 and the ground voltage. Switch 60 may be coupled between the positive input terminal and the second terminal of power inductor 62.

In addition to switches 51-60 and power inductor 62, power converter 26 may include a first output capacitor 66 coupled between the positive terminal of the output of power converter 26 and the ground voltage and a second output capacitor 68 coupled between the negative terminal of the output of power converter 26 and the ground voltage. Each output capacitor 66 and 68 may comprise a passive two-terminal electrical component used to store energy electrostatically in an electric field, and may generate a current in response to a time-varying voltage across the capacitor.

As shown in FIG. 5, power converter 26 may in some embodiments comprise a linear amplifier 70. Functionality of power converter 26 is described in greater detail elsewhere in this disclosure for those embodiments including linear amplifier 70.

As described above, a power converter 26 may operate in a plurality of different operational modes, and may sequentially operate in a number of switch configurations under each operational mode. The plurality of modes may include, without limitation, a single-ended boost mode, a differential-output buck-boost mode, a differential-output buck mode, and a low-voltage mode.

Power converter 26 may operate in a single-ended boost mode when output voltage $V_{OUT}$ has a magnitude significantly larger than the supply voltage $V_{SUPPLY}$ (e.g., $|V_{out}| > V_{SUPPLY} = 2V$). FIG. 6 illustrates a table setting forth switch configurations of power converter 26 when operating in the single-ended boost mode, in accordance with embodiments of the present disclosure. As shown in FIG. 6, when output voltage $V_{OUT}$ is positive, and during a charging phase T1 of power converter 26, converter controller 24 may enable switches 51, 52, and 58 of power converter 26, with such switch configuration resulting in the equivalent circuit depicted in FIG. 7. In such switch configuration, power inductor 62 may be charged via a current flowing between the power supply (e.g., power supply 10) and ground. When output voltage $V_{OUT}$ is positive, and during a discharge phase T2 of power converter 26, converter controller 24 may enable switches 51, 53, and 58 of power converter 26, with such switch configuration resulting in the equivalent circuit depicted in FIG. 8. In such switch configuration, power inductor 62 may be discharged, with charge transferred from the power supply (e.g., power supply 10) to the positive terminal of the output of power converter 26. Similarly, when output voltage $V_{OUT}$ is negative, and during the charging phase T1 of power converter 26, converter controller 24 may enable switches 51, 52, and 59 of power converter 26, wherein in accordance with such switch configuration, power inductor 62 may be charged via a current flowing between the power supply (e.g., power supply 10) and ground. In addition, when output voltage $V_{OUT}$ is negative, and during the discharge phase T2 of power converter 26, converter controller 24 may enable switches 51, 55, and 59 of power converter 26, wherein in accordance with such switch configuration, power inductor 62 may be discharged, with charge transferred from the power supply (e.g., power supply 10) to the negative terminal of the output of power converter 26.

Notably, in the boost configuration, one of either of the terminals of the output of power converter 26 remains grounded in order to provide for operation in the boost mode, thus allowing power converter 26 to act as a boost converter when in the boost mode.

In some embodiments, it may be desirable to operate in a continuous current mode (CCM) as opposed to a discontinuous current mode (DCM) when operating power converter 26 in the single-ended boost mode. This preference is because a CCM boost converter may have lower root-means-square (e.g., ripple) currents compared to a corresponding DCM boost converter.

For an input voltage signal $V_I$ to loop filter 22, loop filter 22 may generate a target current signal $I_{TGT}$ as the controller input signal which may be given by $I_{TGT}=V_I/R_{OUT}$, where $R_{OUT}$ is an impedance of a load at the output of power converter 26. A duration of charging phase T1 may be given by T1=D×TT, where D is a unitless variable given by D=1−($V_{SUPPLY}/V_I$) and TT is a switching period of power converter 26 which is the sum of the durations of the charging phase T1 and the transfer phase T2 (e.g., TT=T1+T2). A change in power inductor current $I_L$ occurring during charging phase T1 may be given by $\Delta I_L = T1 \times (V_{SUPPLY}/L)$ where L is an inductance of power inductor 62. A minimum inductor current $I_{min}$ may be given by:

$$I_{min}=[2 \times TT \times I_{TGT} \times (V_{SUPPLY}-V_I)/L - \Delta I_L^2]/2 \times \Delta I_L$$

and a peak current $I_{pk}$ for inductor current $I_L$ may be given as $I_{pk}=I_{min}+\Delta I_L$.

Power converter 26 may operate in a differential-output buck-boost mode when output voltage $V_{OUT}$ has a magnitude lower than that for which the single-ended boost mode is appropriate (e.g., $|V_{OUT}|<V_{SUPPLY}+2V$) but higher than a particular threshold magnitude (e.g., $|V_{OUT}|>3V$) for which the duration of a charging phase T1 becomes too small to operate power converter 26 in a buck-boost mode. FIG. 9 illustrates a table setting forth switch configurations of power converter 26 when operating in the differential-output buck-boost mode, in accordance with embodiments of the present disclosure. As shown in FIG. 9, when output voltage $V_{OUT}$ is positive, and during a charging phase T1 of power converter 26, converter controller 24 may enable switches 51 and 52 of power converter 26, with such switch configuration resulting in the equivalent circuit depicted in FIG. 10. In such switch configuration, power inductor 62 may be charged via a current flowing between the power supply (e.g., power supply 10) and ground. When output voltage $V_{OUT}$ is positive, and during a discharge phase T2 of power converter 26, converter controller 24 may enable switches 53 and 54 of power converter 26, with such switch configuration resulting in the equivalent circuit depicted in FIG. 11. In such switch configuration, power inductor 62 may be discharged, with charge transferred from the negative terminal of the output of power converter 26 to the positive terminal of the output of power converter 26. Similarly, when output voltage $V_{OUT}$ is negative, and during the charging phase T1 of power converter 26, converter controller 24 may enable switches 51 and 52 of power converter 26, wherein in accordance with such switch configuration, power inductor 62 may be charged via a current flowing between the power supply (e.g., power supply 10) and ground. In addition, when output voltage $V_{OUT}$ is negative, and during the discharge phase T2 of power converter 26, converter controller 24 may enable switches 55 and 56 of power converter 26, wherein in accordance with such switch configuration, power inductor 62 may be discharged, with charge transferred from the positive terminal of the output of power converter 26 to the negative terminal of the output of power converter 26.

Thus, in the differential-output buck-boost mode, power inductor 62 may be charged from $V_{SUPPLY}$ to ground during charging phases T1, and in discharging phases T2, power inductor 62 may be coupled across the output terminals of a load at the output of power converter 26 in order to discharge power inductor 62 and create a differential output. Coupling power inductor 62 across the output terminals in a differential output fashion may lead to a greater charge differential between capacitors 66 and 68 than would be in a single-ended configuration (e.g., with one of the output terminals grounded). Thus, lower power inductor peak currents may be required to achieve the same output current.

Within the output voltage range of operation for the differential-output buck-boost mode, power converter 26 may operate in CCM for larger output voltages (e.g., $7V<V_{OUT}<V_{SUPPLY}+2V$) and DCM for smaller output voltages (e.g., $3V<V_{OUT}<7V$). In DCM, peak current $I_{pk}$ of power inductor 62 may be given by:

$$I_{pk} = \sqrt{\frac{2 \times I_{TGT} \times V_{OUT} \times TT}{L}}$$

where TT is a switching period of power converter 26.

In CCM, a duration of charging phase T1 may be given by T1=D×TT, where D is a unitless variable given by D=$V_{OUT}/(V_{OUT}+V_{SUPPLY})$ and TT is a switching period of power converter 26 which is the sum of the durations of the charging phase T1 and the transfer phase T2 (e.g., TT=T1+T2). A change in power inductor current $I_L$ occurring during charging phase T1 may be given by $\Delta I_L=T1 \times (V_{SUPPLY}/L)$. A minimum inductor current $I_{min}$ may be given by:

$$I_{min}=[I_{OUT} \times TT \times V_{OUT}/L - \Delta I_L^2/2]/\Delta I_L$$

and a peak current $I_{pk}$ for inductor current $I_L$ may be given as $I_{pk}=I_{min}+\Delta I_L$.

Figures 11, 12:
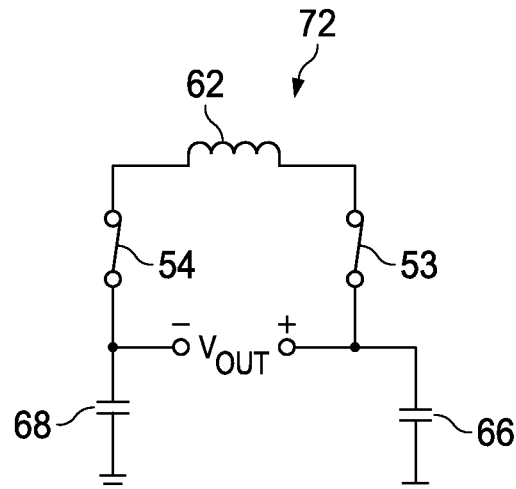
FIG. 11 illustrates an equivalent circuit diagram of selected components of the power converter of FIG. 5 operating in a discharge phase of a differential-output buck-boost mode, in accordance with embodiments of the present disclosure.
FIG. 12 illustrates a table setting forth switch configurations of the power converter of FIG. 5 when operating in a differential-output buck mode, in accordance with embodiments of the present disclosure.

Power converter 26 may operate in a differential-output buck mode when output voltage $V_{OUT}$ has a magnitude lower than that for which the duration of a charging phase T1 becomes too small to operate power converter in a buck-boost mode (e.g., $|V_{OUT}|<3V$) and a magnitude higher than for which the duration of a charging phase T1 becomes too small (e.g. $|V_{OUT}|>1V$) to operate power converter 26 in a buck mode. FIG. 12 illustrates a table setting forth switch configurations of power converter 26 when operating in the differential-output buck-boost mode, in accordance with embodiments of the present disclosure. As shown in FIG. 12, in the differential-output buck mode, switch configurations may not only be based on the polarity of output voltage $V_{OUT}$, but also on whether the common-mode voltage of the positive output terminal and the negative output terminal of power converter 26 is to be increased or decreased to regulate the common-mode voltage at a desired level, as shown in the column with the heading "CM" in FIG. 12. For example, in some embodiments, converter controller 24 may control switches of power converter 26 in order to regulate the common mode to a voltage associated with switched-mode amplifier 20. In some embodiments, the voltage may comprise one-half of the supply voltage $V_{SUPPLY}$.

Figure 13:
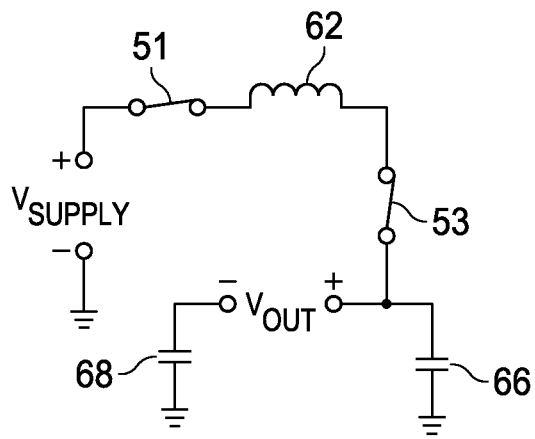
FIG. 13 illustrates an equivalent circuit diagram of selected components of the power converter of FIG. 5 operating in a charging phase of a differential-output buck mode, in accordance with embodiments of the present disclosure.
Figure 14:
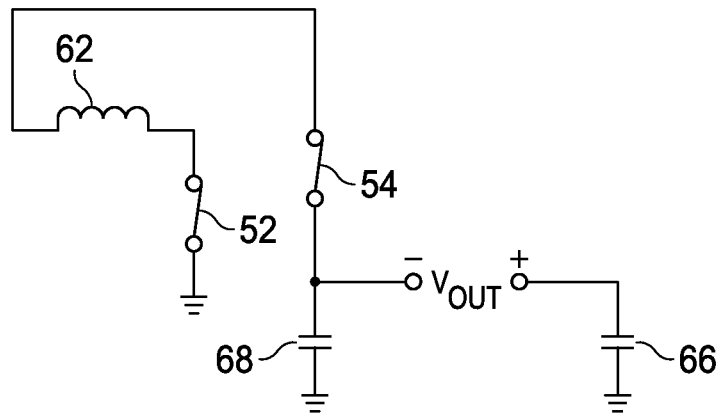
FIG. 14 illustrates an equivalent circuit diagram of selected components of the power converter of FIG. 5 operating in another charging phase of a differential-output buck mode, in accordance with embodiments of the present disclosure.
Figure 15:
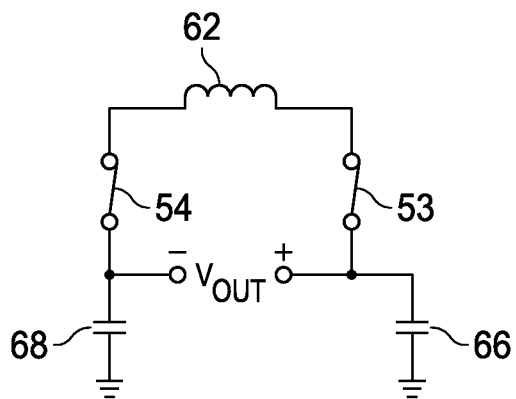
FIG. 15 illustrates an equivalent circuit diagram of selected components of the power converter of FIG. 5 operating in a discharge phase of a differential-output buck mode, in accordance with embodiments of the present disclosure.

As shown in FIG. 12, during a charging phase T1 of power converter 26, when output voltage $V_{OUT}$ is positive and the common-mode voltage of the output terminals is to be increased, converter controller 24 may enable switches 51 and 53 of power converter 26, with such switch configuration resulting in the equivalent circuit depicted in FIG. 13. In such switch configuration, power inductor 62 may be charged via a current flowing between the power supply (e.g., power supply 10) and the positive terminal of the output of power converter 26, thus generating a positive output voltage $V_{OUT}$ and increasing the common-mode voltage by increasing the electrical charge on capacitor 66. On the other hand, during a charging phase T1 of power converter 26, when output voltage $V_{OUT}$ is positive and the common-mode voltage of the output terminals is to be decreased, converter controller 24 may enable switches 52 and 54 of power converter 26, with such switch configuration resulting in the equivalent circuit depicted in FIG. 14. In such switch configuration, power inductor 62 may be charged via a current flowing between the negative terminal of the output of power converter 26 and ground, thus generating a positive output voltage $V_{OUT}$ and decreasing common-mode voltage by decreasing the electrical charge on capacitor 68. During a discharge phase T2 of power converter 26, when target current $I_{TGT}$ is positive and regardless of whether the common-mode voltage of the output terminals is to be increased or decreased, converter controller 24 may enable switches 53 and 54 of power converter 26, with such switch configuration resulting in the equivalent circuit depicted in FIG. 15. In such switch configuration, power inductor 62 may be discharged, with charge transferred from the negative terminal of the output of power converter 26 to the positive terminal of the output of power converter 26 in order to provide a positive output voltage $V_{OUT}$ while maintaining the same common-mode voltage.

Similarly, during a charging phase T1 of power converter 26, when output voltage $V_{OUT}$ is negative and the common-mode voltage of the output terminals is to be increased, converter controller 24 may enable switches 51 and 55 of power converter 26. In such switch configuration, power inductor 62 may be charged via a current flowing between the power supply (e.g., power supply 10) and the negative terminal of the output of power converter 26, thus generating a negative output voltage $V_{OUT}$ and increasing the common-mode voltage by increasing the electrical charge on capacitor 68. On the other hand, during a charging phase T1 of power converter 26, when output voltage $V_{OUT}$ is negative and the common-mode voltage of the output terminals is to be decreased, converter controller 24 may enable switches 52 and 56 of power converter 26. In such switch configuration, power inductor 62 may be charged via a current flowing between the positive terminal of the output of power converter 26 and ground, thus generating a negative output voltage $V_{OUT}$ and decreasing common-mode voltage by decreasing the electrical charge on capacitor 66. During a discharge phase T2 of power converter 26, when output voltage $V_{OUT}$ is negative and regardless of whether the common-mode voltage of the output terminals is to be increased or decreased, converter controller 24 may enable switches 55 and 56 of power converter 26. In such switch configuration, power inductor 62 may be discharged, with charge transferred from the positive terminal of the output of power converter 26 to the negative terminal of the output of power converter 26 in order to provide a negative output voltage $V_{OUT}$ while maintaining the same common-mode voltage.

Thus, during charging phases T1, converter controller 24 may cause power converter 26 to couple a capacitor 66 or 68 to supply voltage $V_{SUPPLY}$ or ground to increase or decrease the total amount of charge in capacitors 66 and 68 in order to regulate common-mode voltage of the output terminals. On the other hand, discharge phases T2 of converter controller 24 may cause power converter 26 to couple a power inductor 62 across the output terminals, which may redistribute charge between capacitors 66 and 68. Accordingly, in the differential-output buck mode, power converter 26 uses common-mode voltage at the output to create differential output voltage $V_{OUT}$, as the duration of charging phase T1 may determine the common mode voltage and differential voltage $V_{OUT}$ while the duration of discharge phase T2 may additionally determine the differential voltage $V_{OUT}$. As compared to other modes of operation, the differential-output buck mode provides for efficient charge transfer as charge is pushed to an output capacitor 66 or 68 during charging phase T1 and redistributed between output capacitors 66 and 68 during discharge phase T2. Because of such charge-transfer scheme, lower peak currents through power inductor 62 may be necessary to transfer charge as compared to other modes. Also, root-mean-square current through switch 51 may be reduced as it is not exercised as much as it is in other modes of operation, which may minimize power dissipation of switch 51. Common-mode voltage at the output terminals may also be well-controlled, as common-mode control is achieved by coupling an output capacitor 66 or 68 to supply voltage $V_{SUPPLY}$ or ground through power inductor 62.

When operating in the differential-output buck mode, power converter 26 may typically operate in DCM, unless power inductor 62 has a very high inductance (e.g., greater than 500 nH). In DCM, peak current $I_{pk}$ of power inductor 62 may be given by:

$$I_{pk} = \sqrt{\frac{2 \times I_{TCT} \times V_{OUT} \times (V_{SUPPLY} - V_{OUT}) \times TT}{L \times V_{SUPPLY}}}$$

where TT is a switching period of power converter 26.

In CCM, a duration of charging phase T1 may be given by T1=D×TT, where D is a unitless variable given by D=$V_{OUT}$/($V_{OUT}$+$V_{SUPPLY}$) and TT is a switching period of power converter 26 which is the sum of the durations of the charging phase T1 and the transfer phase T2 (e.g., TT=T1+T2). A change in power inductor current $I_L$ occurring during charging phase T1 may be given by $\Delta I_L$=T1×($V_{SUPPLY}$-$V_{OUT}$)/2L. A minimum inductor current $I_{min}$ may be given by:

$$I_{min} = [I_{OUT} \times TT \times (V_{SUPPLY} - V_{OUT}) \times TT/(L \times V_{SUPPLY}) - \Delta I_L^2/2]/\Delta I_L$$

and a peak current $I_{pk}$ for inductor current $I_L$ may be given as $I_{pk}$=$I_{min}$+$\Delta I_L$.

Power converter 26 may operate in a low-voltage mode in order to allow output voltage $V_{OUT}$ to cross zero, as the differential-output buck mode and operational modes discussed above may not be capable of effectuating a polarity change in output voltage $V_{OUT}$. Accordingly, when output voltage $V_{OUT}$ has a magnitude lower than a particular threshold (e.g., |$V_{OUT}$|<1V), power converter 26 may operate in the low-voltage mode. As described below, the low-voltage mode may be implemented in one of a plurality of ways, including a single-ended buck mode and a linear amplifier mode.

Power converter 26 may transition to operation in a differential-output turn-around mode from the differential-output buck mode when, while operating in the differential-output buck mode, output voltage $V_{OUT}$ has a polarity opposite that of a target voltage $V_{TGT}$ for output voltage $V_{OUT}$ wherein target voltage $V_{TGT}$ corresponds to input signal INPUT. In such a situation, output voltage $V_{OUT}$ may need to effectively change polarity in a quick fashion, which may not be possible using any of the operational modes described above. FIG. 16 illustrates a table setting forth switch configurations of power converter 26 when operating in the differential-output turn-around mode, in accordance with embodiments of the present disclosure. As shown in FIG. 16, in the differential-output turn-around mode, switch configurations may not only be based on the polarities of output voltage $V_{OUT}$ and target voltage $V_{TGT}$, but also on whether the common-mode voltage of the positive output terminal and the negative output terminal of power converter 26 is to be increased or decreased to regulate the common-mode voltage at a desired level, as shown in the column with the heading "CM" in FIG. 16. For example, in some embodiments, converter controller 24 may control switches of power converter 26 in order to regulate the common mode to a voltage associated with switched-mode amplifier 20. In some embodiments, the voltage may comprise one-half of the supply voltage $V_{SUPPLY}$.

As shown in FIG. 16, during a charging phase T1 of power converter 26, when output voltage $V_{OUT}$ is negative, target voltage $V_{TGT}$ is positive (meaning output voltage $V_{OUT}$ needs to switch from a negative to a positive polarity), and the common-mode voltage of the output terminals is to be increased, converter controller 24 may enable switches 51 and 53 of power converter 26, with such switch configuration resulting in the equivalent circuit depicted in FIG. 17. In such switch configuration, power inductor 62 may be charged via a current flowing between the power supply (e.g., power supply 10) and the positive terminal of the output of power converter 26, thus generating an increasing output voltage $V_{OUT}$ and increasing the common-mode voltage by increasing the electrical charge on capacitor 66. On the other hand, during a charging phase T1 of power converter 26, when output voltage $V_{OUT}$ is negative, target voltage $V_{TGT}$ is positive (meaning output voltage $V_{OUT}$ needs to switch from a negative to a positive polarity), and the common-mode voltage of the output terminals is to be decreased, converter controller 24 may enable switches 52 and 54 of power converter 26, with such switch configuration resulting in the equivalent circuit depicted in FIG. 18. In such switch configuration, power inductor 62 may be charged via a current flowing between the negative terminal of the output of power converter 26 and ground, thus generating an increasing output voltage $V_{OUT}$ and decreasing common-mode voltage by decreasing the electrical charge on capacitor 68. During a discharge phase T2 of power converter 26, when output voltage $V_{OUT}$ is negative, target voltage $V_{TGT}$ is positive (meaning output voltage $V_{OUT}$ needs to switch from a negative to a positive polarity), and regardless of whether the common-mode voltage of the output terminals is to be increased or decreased, converter controller 24 may enable switches 53 and 57 of power converter 26, with such switch configuration resulting in the equivalent circuit depicted in FIG. 19. In such switch configuration, power inductor 62 may be discharged, with charge transferred from the ground to the positive terminal of the output of power converter 26 in order to provide an increasing output voltage $V_{OUT}$.

Similarly, during a charging phase T1 of power converter 26, when output voltage $V_{OUT}$ is positive, target voltage $V_{TGT}$ is negative (meaning output voltage $V_{OUT}$ needs to switch from a positive to a negative polarity), and the common-mode voltage of the output terminals is to be increased, converter controller 24 may enable switches 51 and 55 of power converter 26. In such switch configuration, power inductor 62 may be charged via a current flowing between the power supply (e.g., power supply 10) and the negative terminal of the output of power converter 26, thus generating a decreasing output voltage $V_{OUT}$ and increasing the common-mode voltage by increasing the electrical charge on capacitor 68. On the other hand, during a charging phase T1 of power converter 26, when output voltage $V_{OUT}$ is positive, target voltage $V_{TGT}$ is negative (meaning output voltage $V_{OUT}$ needs to switch from a positive to a negative polarity), and the common-mode voltage of the output terminals is to be decreased, converter controller 24 may enable switches 52 and 56 of power converter 26. In such switch configuration, power inductor 62 may be charged via a current flowing between the positive terminal of the output of power converter 26 and ground, thus generating a decreasing output voltage $V_{OUT}$ and decreasing common-mode voltage by decreasing the electrical charge on capacitor 66. During a discharge phase T2 of power converter 26, voltage $V_{OUT}$ is positive, target voltage $V_{TGT}$ is negative (meaning output voltage $V_{OUT}$ needs to switch from a positive to a negative polarity), and regardless of whether the common-mode voltage of the output terminals is to be increased or decreased, converter controller 24 may enable switches 55 and 57 of power converter 26. In such switch configuration, power inductor 62 may be discharged, with charge transferred from the ground to the negative terminal of the output of power converter 26 in order to provide a decreasing output voltage $V_{OUT}$.

Thus, during charging phases T1, converter controller 24 may cause power converter 26 to couple a capacitor 66 or 68 to supply voltage $V_{SUPPLY}$ or ground to increase or decrease the total amount of charge in capacitors 66 and 68 in order to regulate common-mode voltage of the output terminals. On the other hand, discharge phases T2 of converter controller 24 may cause power converter 26 to couple a power inductor 62 between the ground and one of the output terminals, to increase or decrease output voltage $V_{OUT}$. Accordingly, in the differential-output turn-around mode, power converter 26 uses common-mode voltage at the output to create differential output voltage $V_{OUT}$, as the duration of charging phase T1 may determine the common mode voltage and differential voltage $V_{OUT}$ while the duration of discharge phase T2 may additionally determine the differential voltage $V_{OUT}$.

FIG. 20 illustrates a table setting forth switch configurations of power converter 26 when operating in the single-ended buck mode, in accordance with embodiments of the present disclosure. As shown in FIG. 20, when target voltage $V_{TGT}$ is positive and the common-mode voltage of the output terminals is to be increased, power converter 26 may have a charging phase T1 in which converter controller 24 enables switches 51 and 53 (as shown in the equivalent circuit depicted in FIG. 21), followed immediately by a discharge phase T2 in which converter controller 24 enables switches 54 and 60 of power converter 26 (as shown in the equivalent circuit depicted in FIG. 22). In such charging phase T1, power inductor 62 may be charged via a current flowing between the power supply (e.g., power supply 10) and the positive terminal of the output of power converter 26, thus generating an increasing output voltage $V_{OUT}$ and increasing the common-mode voltage by increasing the electrical charge on capacitor 66. In such discharge phase T2, power inductor 62 may be discharged, with charge transferred from the negative terminal of the output of power converter 26 to the power supply in order to provide an increasing output voltage $V_{OUT}$. Discharge phase T2 may have the effect of decreasing the common-mode voltage, but the net effect of charging phase T1 and discharge phase T2 may be an increase in common-mode voltage.

Also as shown in FIG. 20, when target voltage $V_{TGT}$ is positive and the common-mode voltage of the output terminals is to be decreased, power converter 26 may have a charging phase T1 in which converter controller 24 enables switches 52 and 54 (as shown in the equivalent circuit depicted in FIG. 23), followed immediately by a discharge phase T2 in which converter controller 24 enables switches 53 and 57 of power converter 26 (as shown in the equivalent circuit depicted in FIG. 24). In such charging phase T1, power inductor 62 may be charged via a current flowing between the negative terminal of the output of power converter 26 and ground, thus generating an increasing output voltage $V_{OUT}$ and decreasing common-mode voltage by decreasing the electrical charge on capacitor 68. In such discharge phase T2, power inductor 62 may be discharged, with charge transferred from the ground to the positive terminal of the output of power converter 26 in order to provide an increasing output voltage $V_{OUT}$. Discharge phase T2 may have the effect of increasing the common-mode voltage, but the net effect of charging phase T1 and discharge phase T2 may be a decrease in common-mode voltage.

Similarly, when target voltage $V_{TGT}$ is positive and the common-mode voltage of the output terminals is to be increased, power converter 26 may have a charging phase T1 in which converter controller 24 enables switches 51 and 55, followed immediately by a discharge phase T2 in which converter controller 24 enables switches 56 and 60 of power converter 26. In such charging phase T1, power inductor 62 may be charged via a current flowing between the power supply (e.g., power supply 10) and the negative terminal of the output of power converter 26, thus generating a decreasing output voltage $V_{OUT}$ and increasing the common-mode voltage by increasing the electrical charge on capacitor 68. In such discharge phase T2, power inductor 62 may be discharged, with charge transferred from the positive terminal of the output of power converter 26 to the power supply in order to provide a decreasing output voltage $V_{OUT}$. Discharge phase T2 may have the effect of decreasing the common-mode voltage, but the net effect of charging phase T1 and discharge phase T2 may be an increase in common-mode voltage.

On the other hand, when target voltage $V_{TGT}$ is positive and the common-mode voltage of the output terminals is to be increased, power converter 26 may have a charging phase T1 in which converter controller 24 enables switches 52 and 56, followed immediately by a discharge phase T2 in which converter controller 24 enables switches 55 and 57 of power converter 26. In such charging phase T1, power inductor 62 may be charged via a current flowing between the positive terminal of the output of power converter 26 and ground, thus generating a decreasing output voltage $V_{OUT}$ and decreasing common-mode voltage by decreasing the electrical charge on capacitor 66. In such discharge phase T2, power inductor 62 may be discharged, with charge transferred from the ground to the negative terminal of the output of power converter 26 in order to provide a decreasing output voltage $V_{OUT}$. Discharge phase T2 may have the effect of increasing the common-mode voltage, but the net effect of charging phase T1 and discharge phase T2 may be a decrease in common-mode voltage.

In the linear amplifier mode, linear amplifier 70 may receive a digital linear amplifier input signal from converter controller 24, loop filter 22, or elsewhere within switched mode amplifier 20. For example, in some embodiments, digital linear amplifier input signal may comprise an output of a quantizer of loop filter 22. To provide for fine resolution in the low-voltage mode of output voltages at magnitudes lower than the operational range of the differential-output buck mode, power converter 26 may operate in a linear amplifier mode, in which linear amplifier 70 of FIG. 5, operating in effect as a digital-to-analog converter (DAC), may be used to convert the digital linear amplifier control signal (which may be indicative of a desired output current $I_{OUT}$) communicated from loop filter 22, converter controller 24, or elsewhere within switched mode amplifier into an analog current driven to a load coupled between output terminals of power converter 26. Linear amplifier 70, which is shown as a current source in FIG. 5, may comprise any system, device, or apparatus configured to generate a current in response to an input signal.

Figure 25:
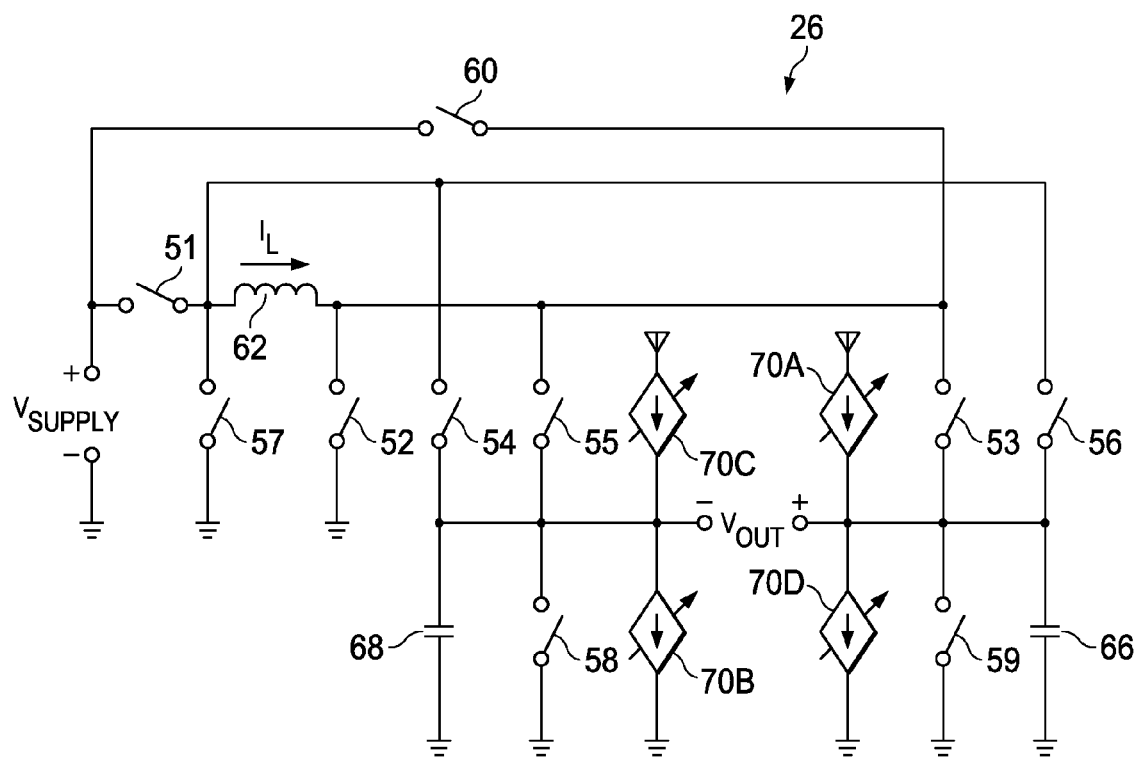
FIG. 25 illustrates the power converter of FIG. 5 including a linear amplifier implemented as a quadrant digital-to-analog converter, in accordance with embodiments of the present disclosure.

An example embodiment for linear amplifier 70 is depicted in FIG. 25, in which linear amplifier 70 is embodied as a current-mode quadrant DAC having variable current sources 70A, 70B, 70C, and 70D. In the linear amplifier mode, when output voltage $V_{OUT}$ is positive, current sources 70A and 70B may be enabled to deliver a current to a load at the output of power converter 26 with a magnitude to generate the desired positive output voltage $V_{OUT}$. Conversely, when output voltage $V_{OUT}$ is negative, current sources 70C and 70D may be enabled to deliver a current to a load at the output of power converter 26 with a magnitude to generate the desired negative output voltage $V_{OUT}$.

Figure 26:
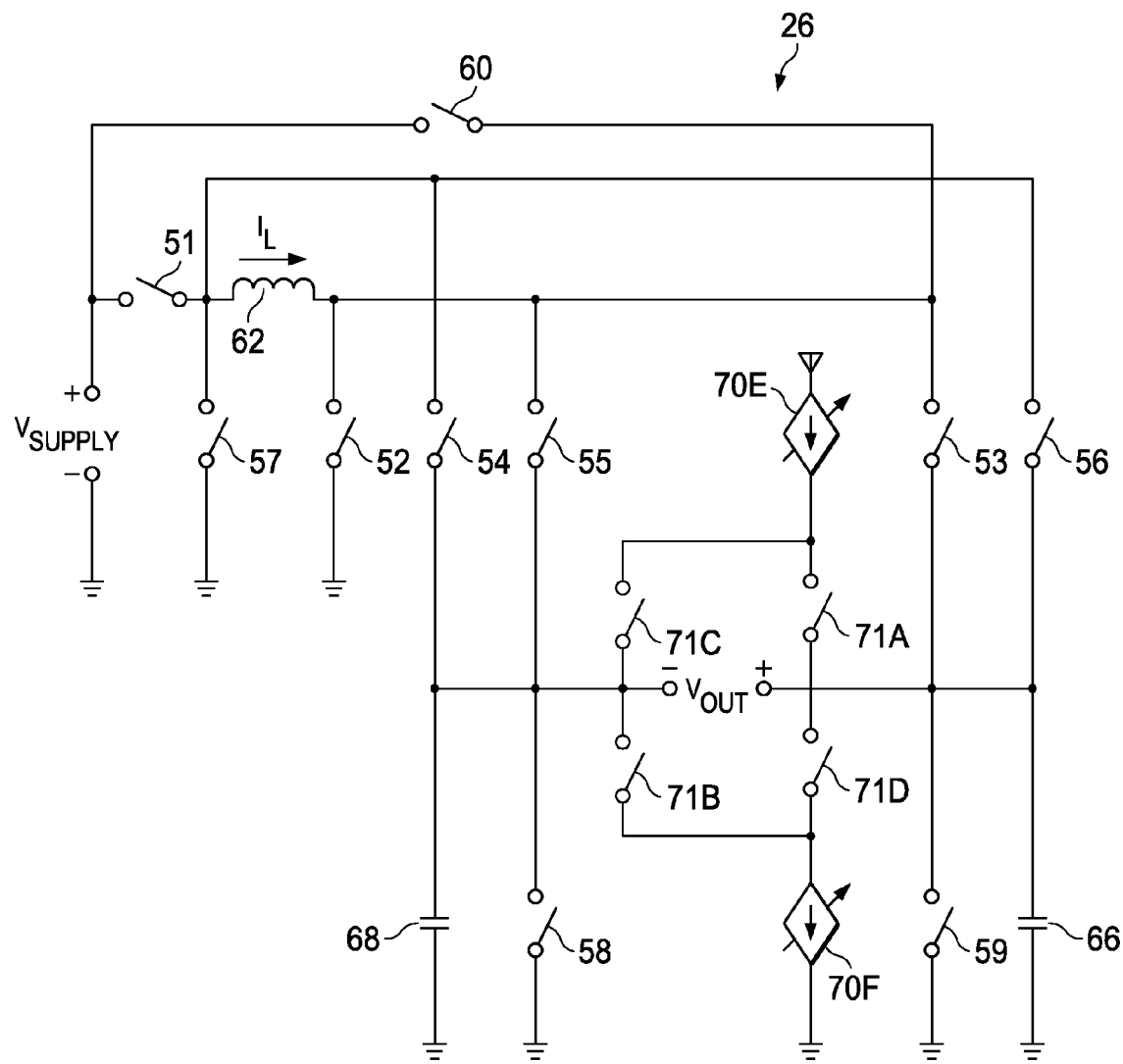
FIG. 26 illustrates the power converter of FIG. 5 including a linear amplifier implemented as a hemispherical digital-to-analog converter, in accordance with embodiments of the present disclosure.

Another example embodiment for linear amplifier 70 is shown in FIG. 26, in which linear amplifier 70 is embodied as a current-mode hemispherical DAC having variable current sources 70E and 70F and switches 71A, 71B, 71C, and 71D. In the linear amplifier mode, when output voltage $V_{OUT}$ is positive, switches 71A and 71B may be enabled (e.g., closed or on) and switches 71C and 71D may be disabled (e.g., open or off) to deliver a current to a load at the output of power converter 26 with a magnitude to generate the desired positive output voltage $V_{OUT}$. Conversely, when output voltage $V_{OUT}$ is negative, switches 71C and 71D may be enabled (e.g., closed or on) and switches 71A and 71B may be disabled (e.g., open or off) to deliver a current to a load at the output of power converter 26 with a magnitude to generate the desired negative output voltage $V_{OUT}$.

In some embodiments, converter controller 24 may control switches of power converter 26 such that the switches perform synchronous rectification, wherein all switches of power converter 26 are controlled (e.g., disabled if inductor current $I_L$ decrease to zero) in order to prevent inductor current $I_L$ from decreasing below zero. In other embodiments, power converter 26 may include a diode (e.g., with anode terminal coupled to power inductor 62 and cathode terminal coupled to switches 53 and 55) in order to prevent inductor current $I_L$ from decreasing below zero.

Figure 27:
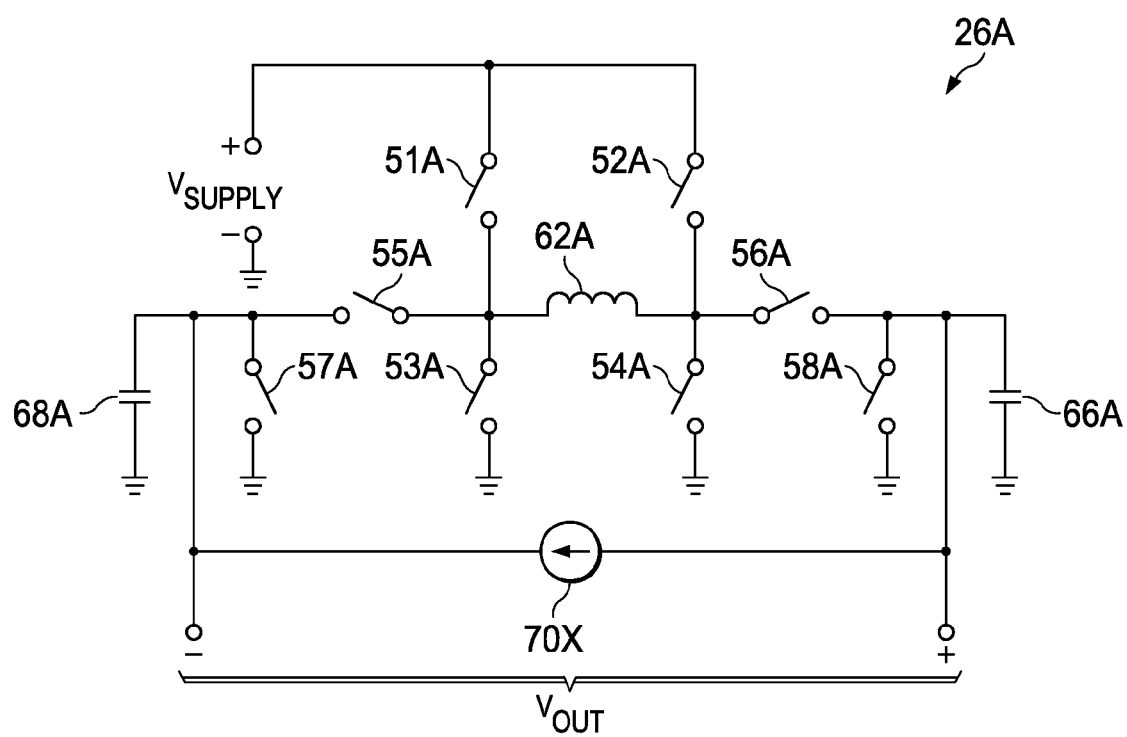
FIG. 27 illustrates a circuit diagram of selected components of another example power converter, in accordance with embodiments of the present disclosure.

FIG. 27 illustrates a circuit diagram of selected components of another example power converter 26A, in accordance with embodiments of the present disclosure. Power converter 26A may, in some embodiments, be used as an alternative to power converter 26 depicted in FIG. 5, and may in many respects, be mathematically equivalent to power converter 26 depicted in FIG. 5 and/or operate in a similar manner to power converter 26 depicted in FIG. 5. As shown in FIG. 27, power converter 26A may receive at its input a voltage $V_{SUPPLY}$ (e.g., provided by power supply 10) at input terminals, including a positive input terminal and a negative input terminal which may be coupled to a ground voltage, and may generate at its output a differential output voltage $V_{OUT}$. Power converter 26A may comprise a power inductor 62A, and a plurality of switches 51A-58A. Power converter 26A may also include across its output terminals a linear amplifier 70X identical or similar to linear amplifier 70 of power amplifier 26. Power inductor 62A may comprise any passive two-terminal electrical component which resists changes in electrical current passing through it and such that when electrical current flowing through it changes, a time-varying magnetic field induces a voltage in power inductor 62A, in accordance with Faraday's law of electromagnetic induction, which opposes the change in current that created the magnetic field.

Each switch 51A-58A may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 51A-58A (e.g., control signals communicated from converter controller 24) are not depicted although such control signals would be present to selectively enable and disable switches 51A-58A. In some embodiments, a switch 51A-58A may comprise an n-type metal-oxide-semiconductor field-effect transistor. Switch 51A may be coupled between the positive input terminal and a first terminal of power inductor 62A. Switch 52A may be coupled between the positive input terminal and a second terminal of power inductor 62A. Switch 53A may be coupled between the first terminal of power inductor 62A and the ground voltage. Switch 54A may be coupled between the second terminal of power inductor 62A and the ground voltage. Switch 55A may be coupled between the first terminal of power inductor 62A and a negative terminal of the output of power converter 26A. Switch 56A may be coupled between the second terminal of power inductor 62A and a positive terminal of the output of power converter 26A. Switch 57A may be coupled between the negative terminal of the output of power converter 26A and the ground voltage. Switch 58A may be coupled between the positive terminal of the output of power converter 26A and the ground voltage.

In addition to switches 51A-58A and power inductor 62A, power converter 26A may include a first output capacitor 66A coupled between the positive terminal of the output of power converter 26A and the ground voltage and a second output capacitor 68A coupled between the negative terminal of the output of power converter 26A and the ground voltage. Each output capacitor 66A and 68A may comprise a passive two-terminal electrical component used to store energy electrostatically in an electric field, and may generate a current in response to a time-varying voltage across the capacitor.

Figure 28:
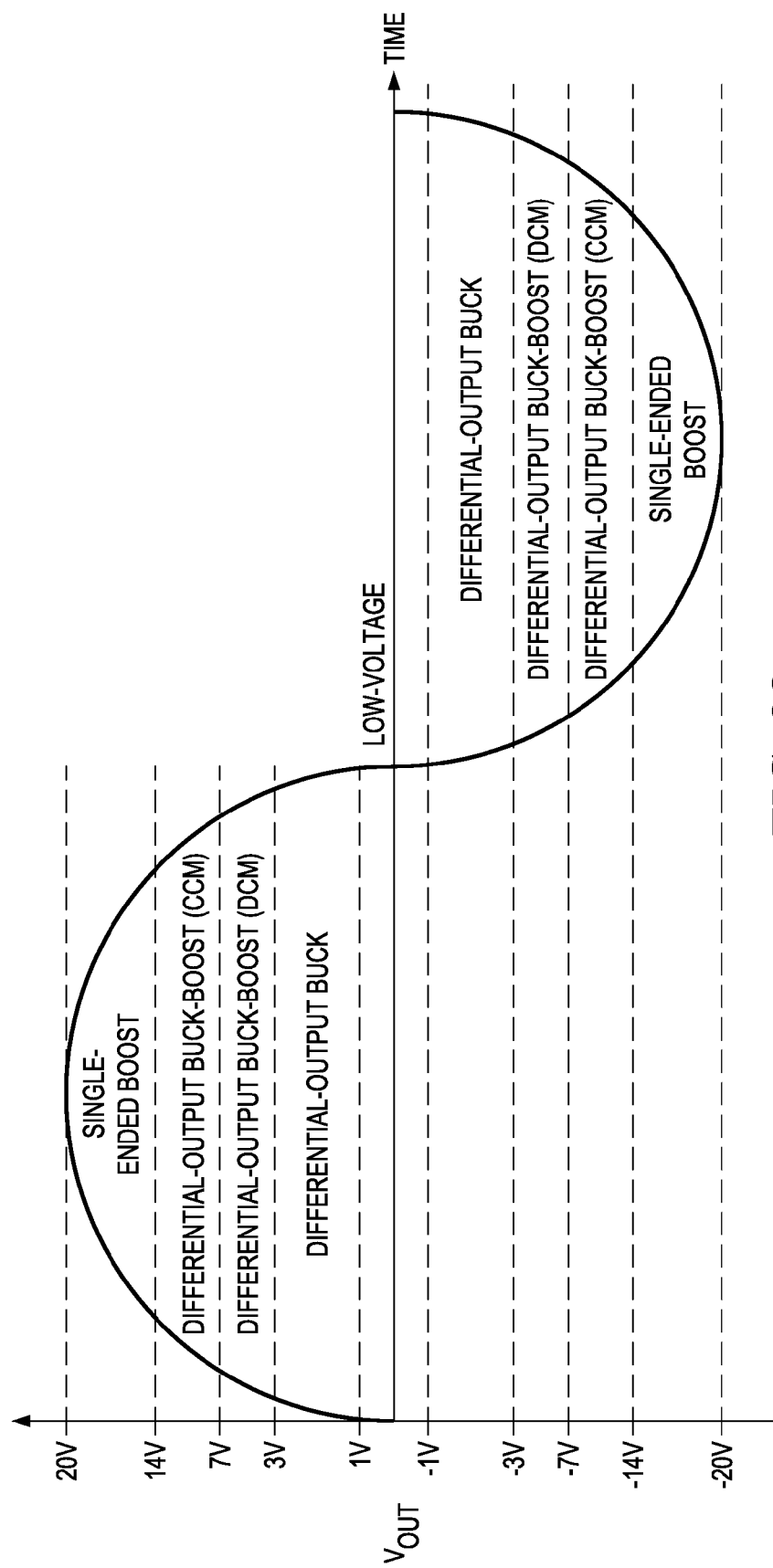
FIG. 28 illustrates a graph of an example output voltage having a sinusoidal waveform, the graph indicating example ranges for operation in the various operational modes of the power converter of FIG. 5, in accordance with embodiments of the present disclosure.

FIG. 28 illustrates a graph of an example output voltage $V_{OUT}$ having a sinusoidal waveform, the graph indicating example ranges for operation in the various operational modes of power converter 26. Thus, for a full-scale sinusoidal signal, power converter 26 may sequentially operate in the low-voltage mode (e.g., single-ended buck, or linear amplifier mode), the differential-output buck mode, the differential output buck-boost mode, the single-ended boost mode, the differential output buck-boost mode, the differential-output buck mode, and the low-voltage mode (e.g., single-ended buck, or linear amplifier mode) for each half-cycle of output voltage $V_{OUT}$. Although not shown in FIG. 28, in some embodiments, while operating in the differential-output buck mode, power converter 26 may switch to operation in the differential-output turn-around mode, in order to change a signal polarity of the output voltage $V_{OUT}$ in response to a target voltage corresponding to input signal INPUT having an opposite polarity of output voltage $V_{OUT}$. In addition, in these and other embodiments, the low-voltage mode may employ the differential-output turn-around mode or a similar mode (e.g., instead of the single-ended buck or linear amplifier mode) in order to operate at lower voltage magnitudes and change the polarity of output voltage $V_{OUT}$.

Figure 29:
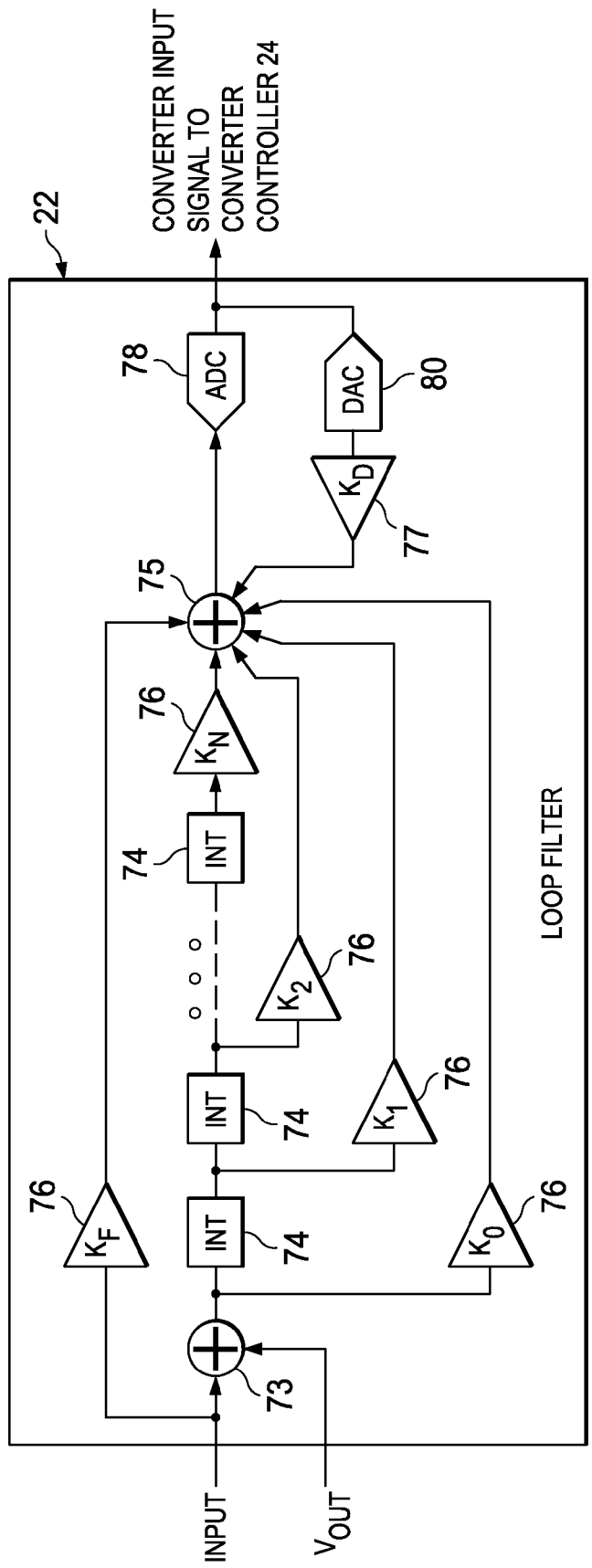
FIG. 29 illustrates a block diagram of selected components of an example loop filter, in accordance with embodiments of the present disclosure.

FIG. 29 illustrates a block diagram of selected components of an example loop filter 22, in accordance with embodiments of the present disclosure. In some embodiments, loop filter 22 depicted in FIG. 29 may implement all or a portion of loop filter 22 described with respect to FIG. 4.

Loop filter 22 may comprise a delta-sigma filter or similar filter which may have the function of moving quantization errors outside the audio band. Loop filter 22 may include an input summer 73 for generating a difference between an input signal (e.g., an analog voltage signal $V_{IN}$) and a feedback signal (e.g., output voltage $V_{OUT}$), and one or more integrator stages 74, such that loop filter 22 operates as analog filter of an error signal equal to the difference between the input signal and the feedback signal, and generates, at the output of output summer 75 a filtered analog signal to analog-to-digital converter (ADC) 78 based on the input signal and the feedback signal. The inputs to output summer 75 may include the input signal as modified by a feed-forward gain coefficient $K_F$ applied by a gain element 76, the outputs of individual integrator stages 74 as each is modified by a respective integrator gain coefficient $K_1, K_2, \ldots, K_N$ applied by gain elements 76, and the output of a feedback digital-to-analog converter 80 as modified by a delay-compensation coefficient $K_D$ applied by a gain element 77 in order to compensate for excess loop delay of loop filter 22.

ADC 78 may comprise any system, device, or apparatus for converting the analog output signal generated by loop filter 22 (e.g., the output of output summer 75) into an equivalent digital signal, which, in some embodiments, may represent a desired output voltage to be generated at the output of switched mode amplifier 20 (e.g., across the terminals labeled $V_{OUT}$ in FIG. 5). Such digital signal or a derivative thereof (e.g., a current signal based on the input signal) may be communicated to converter controller 24, such that converter controller 24 may control switches of power converter 26 in accordance with a selected mode corresponding to such quantized integrated error.

DAC 80 may comprise any suitable system, device, or apparatus configured to convert the digital signal into an equivalent analog feedback signal.

Figure 30:
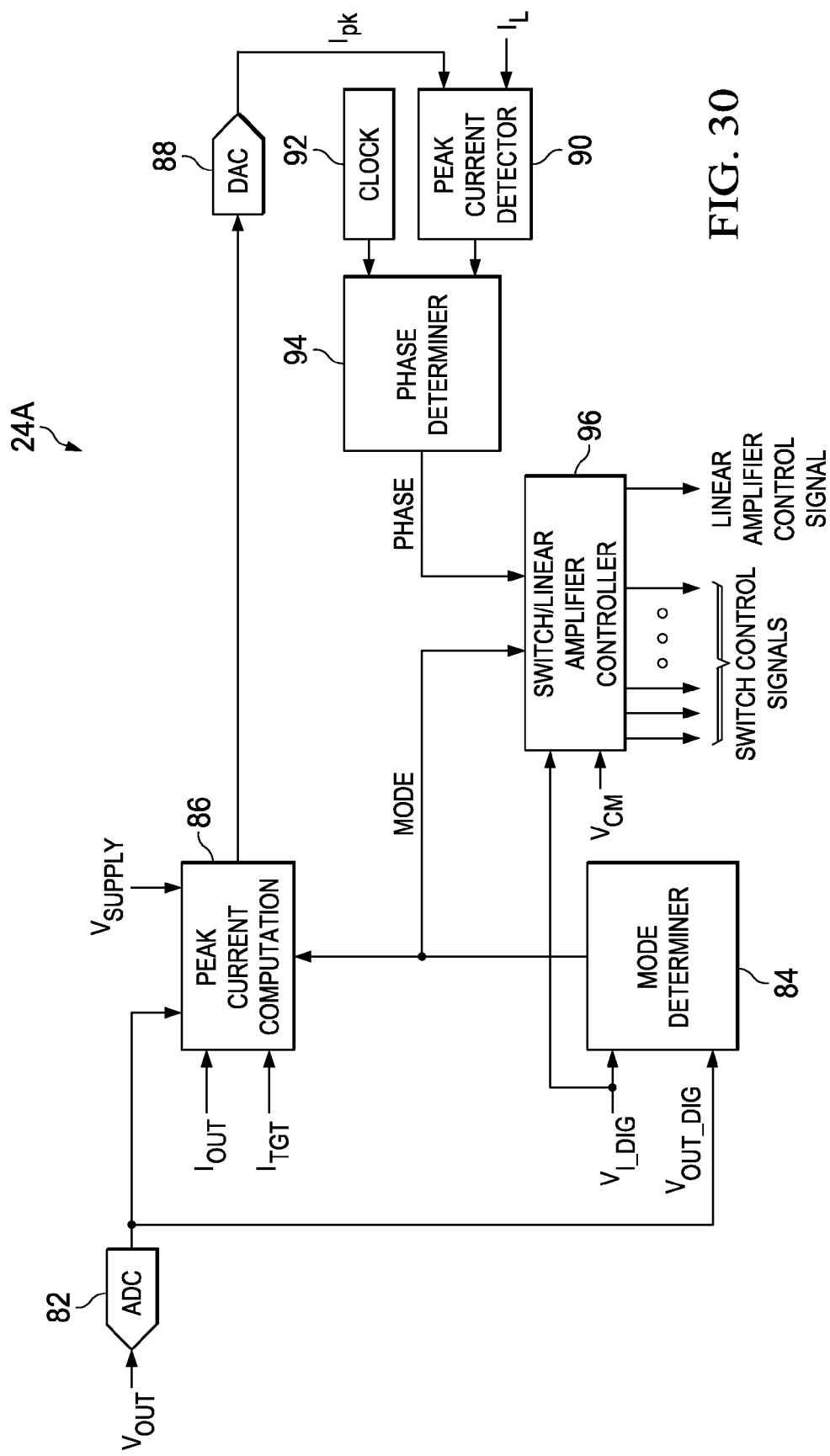
FIG. 30 illustrates a block diagram of selected components of a power converter control, in accordance with embodiments of the present disclosure.

FIG. 30 illustrates a block diagram of selected components of an example converter controller 24A, in accordance with embodiments of the present disclosure. In some embodiments, converter controller 24A depicted in FIG. 30 may implement all or a portion of converter controller 24 described with respect to FIG. 4. In the embodiments represented by FIG. 30 the controller input signal received by converter controller 24A is a target current signal $I_{TGT}$. As shown in FIG. 30, converter controller 24A may implement an ADC 82, a mode determiner 84, a peak current computation block 86, a DAC 88, a peak current detector 90, a clock 92, a phase determiner 94, and a switch/linear amplifier controller 96.

ADC 82 may comprise any system, device, or apparatus configured to convert analog output voltage $V_{OUT}$ (or a derivative thereof) into an equivalent digital signal $V_{OUT\_DIG}$.

Mode determiner 84 may comprise any system, device, or apparatus configured to select a mode of operation from a plurality of modes of operation (e.g., single-ended boost mode, differential-output buck-boost mode, differential-output buck mode, low-voltage mode, etc.) based on digital output voltage signal $V_{OUT\_DIG}$ (or another signal indicative of output voltage $V_{OUT}$) and/or a digital input voltage signal $V_{I\_DIG}$ indicative of input voltage $V_{IN}$. For example, mode determiner 82 may select the mode of operation based upon a voltage range of digital output voltage signal $V_{OUT\_DIG}$, digital input voltage signal $V_{I\_DIG}$, or a signal derivative or indicative thereof, such as analog feedback voltage $V_{FB}$ described in greater detail below with respect to FIG. 32 (e.g., select single-ended boost mode for $|V_{FB}|>14V$, select differential-output buck-boost mode for $3V<|V_{FB}|<14V$, select differential-output buck mode for $1V<|V_{FB}|<3V$, and select the low-voltage mode for $|V_I|<1V$).

Peak current computation block 86 may comprise any system, device, or apparatus configured to compute a peak current $I_{pk}$ to be driven through power inductor 62 during a switching cycle of power converter 26. Such peak current $I_{pk}$ may be calculated based on the selected mode of operation, digital output voltage signal $V_{OUT\_DIG}$ (or another signal indicative of output voltage $V_{OUT}$), supply voltage $V_{SUPPLY}$, output current $I_{OUT}$ (or another signal indicative of output current $I_{OUT}$), and/or target current $I_{TGT}$ in accordance with the various equations for peak current $I_{pk}$ set forth above.

DAC 88 may comprise any system, device, or apparatus configured to convert a digital signal generated by peak current computation block 106 indicative of peak current $I_{pk}$ into an equivalent analog peak current signal $I_{pk}$.

Peak current detector 90 may comprise any system, device, or apparatus configured to compare power inductor current $I_L$ to the analog peak current signal $I_{pk}$ and generate an output signal indicative of the comparison, thus providing an indication for when power inductor current $I_L$ has reached its desired peak current. Power inductor current $I_L$ reaching its desired peak current may indicate the end of a charging phase T1 and beginning of a transfer phase T2 of power converter 26.

Clock 92 may comprise any system, device, or apparatus configured to generate a periodic timing signal indicative of an occurrence of or within a switching cycle of power converter 26. For example, a zero crossing, edge, or other characteristic of a waveform generated by clock 92 may indicate the beginning of a charging phase T1 of power converter 26.

Phase determiner 94 may comprise any system, device, or apparatus configured to, based on the outputs of peak current detector 90 and clock 92, determine which phase (e.g., charging phase T1 or discharge phase T2) power converter 26 is to operate.

Switch/linear amplifier controller 96 may comprise any system, device, or apparatus configured to, based on the mode of operation, phase, polarity of digital input signal $V_{I\_DIG}$ (or another signal indicative of input voltage $V_{IN}$ or output voltage $V_{OUT}$), and (for the differential-output buck mode of power converter 26) a common-mode voltage $V_{CM}$ of the output terminals of power converter 26, generate switch control signals for controlling the switches of power converter 26 and/or one or more control signals for controlling linear amplifier 70.

Thus, during each switching cycle for converter controller 24A, converter controller 24A may select a mode of operation based on input voltage $V_{IN}$ and output voltage $V_{OUT}$, calculate a peak current $I_{pk}$ based on input voltage $V_{IN}$, output voltage $V_{OUT}$, target current signal $I_{TGT}$, and/or output current $I_{OUT}$, and use information regarding the selected mode and the phase of power converter 26 to select a switch configuration to control the switches of power converter 26. In alternative embodiments, rather than operating as a peak current system as depicted in FIG. 28, converter controller 24 may operate as a time-based system based on measurements of supply voltage $V_{SUPPLY}$, output voltage $V_{OUT}$, and output current $I_{OUT}$.

Thus, in the various embodiments disclosed herein, the choice of sequence for switches of power converter 26 may be made consistent with a desired change in output voltage $V_{OUT}$. By repeatedly increasing and decreasing output voltage $V_{OUT}$ in small steps, output voltage $V_{OUT}$ may be made to follow, on average, the desired audio signal. Accordingly, quantization error present in output voltage $V_{OUT}$ may be moved outside the audio band in a manner similar to a delta-sigma modulator.

Figure 31:
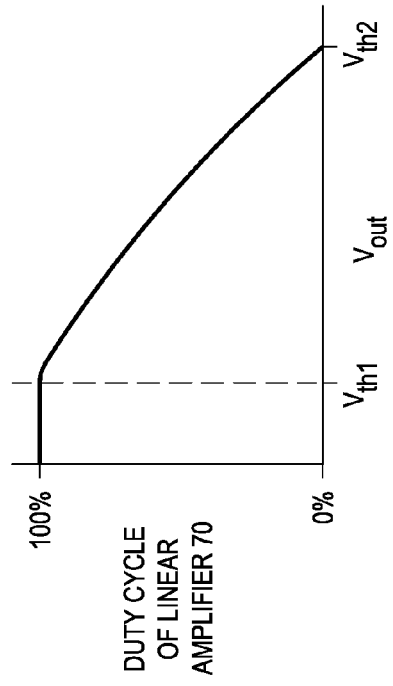
FIG. 31 illustrates a graph of an example function of a duty cycle of a linear amplifier versus an output voltage of a power stage in accordance with embodiments of the present disclosure.

In the foregoing discussion, it is contemplated that linear amplifier 70 is used in a low-voltage mode of operation of power converter 26 in which output voltage $V_{OUT}$ is below a particular threshold magnitude of output voltage $V_{OUT}$. However, in other embodiments, linear amplifier 70 may be operational to generate a current to output terminals of power converter 26 at voltages above such threshold magnitude. For example, in some embodiments, converter controller 24 may be able to, when output voltage $V_{OUT}$ is greater than a threshold magnitude, sequentially operate switches 51-60 as described herein to generate at least a portion of output voltage $V_{OUT}$, and also sequentially enable and disable linear amplifier 70 to deliver electrical energy to a load at the output terminals of power converter 26 in accordance with a probability (e.g., a duty cycle) which is a function of output voltage $v_{OUT}$. FIG. 31 illustrates a graph of an example function of a duty cycle of linear amplifier 70 versus output voltage $V_{OUT}$, representing a probability that amplifier 70 delivers electrical energy to a load at the output terminals of power converter 26 for given magnitudes of output voltage $V_{OUT}$. For example, at magnitudes of output voltage $V_{OUT}$ below a threshold voltage $V_{th1}$, linear amplifier 70 may have a 100% duty cycle, converter controller 24 may disable operation of switches 51-60, and linear amplifier 70 may supply the entirety of the electrical current required to generate output voltage $V_{OUT}$. When the magnitude of output voltage $V_{OUT}$ exceeds threshold voltage $V_{th1}$, converter controller 24 may then enable power converter 26 to sequentially apply switch configurations from a plurality of switch configurations to selectively activate or deactivate each of the plurality of switches 51-60 in order to transfer electrical energy to the load, while also enabling the linear amplifier 70 to deliver electrical energy to the load in accordance with a probability which is a function of output voltage $v_{OUT}$. Above a second threshold voltage $V_{th2}$, the probability of amplifier 70 being enabled may equal zero, such that converter controller 24 may completely disable linear amplifier 70 from delivering electrical energy to the load but continue to control switches 51-60 of power converter 26 to sequentially apply switch configurations from the plurality of switch configurations to selectively activate or deactivate each of the plurality of switches 51-60 in order to transfer electrical energy to the load.

As described above, the controller input signal generated by loop filter 22 may serve as a digital input signal to the power stage comprising converter controller 24 and power converter 26, such that power converter 26 generates output voltage $v_{OUT}$ responsive to such digital input signal (e.g., output voltage $v_{OUT}$ is a function of such digital input signal). In some embodiments, converter controller 24 may control linear amplifier 70 to deliver electrical energy to a load at the output terminals of power converter 26 in accordance with one or more least significant bits of the digital input signal and also control the plurality of switches 51-60 to transfer electrical energy to the load in accordance with bits of the digital input signal other than the one or more least significant bits. Accordingly, below a particular magnitude of output voltage $v_{OUT}$, output voltage $v_{OUT}$ may be represented entirely by the one or more least significant bits of the digital input signal, in which case converter controller 24 may enable linear amplifier 70 to generate output voltage $v_{OUT}$ as a function of the digital input signal while disabling the switches 51-60 of power converter 26 from delivering electrical energy to the load. On the other hand, above such particular magnitude of output voltage $v_{OUT}$, converter controller 24 may enable linear amplifier 70 to generate a portion of output voltage $v_{OUT}$ corresponding to the one or more least significant bits of the digital input signal while controlling the sequential operation of switches 51-60 of power converter 26 to generate the portion of output voltage $v_{OUT}$ corresponding to bits of the digital input signal other than the one or more least significant bits.

Figure 32:
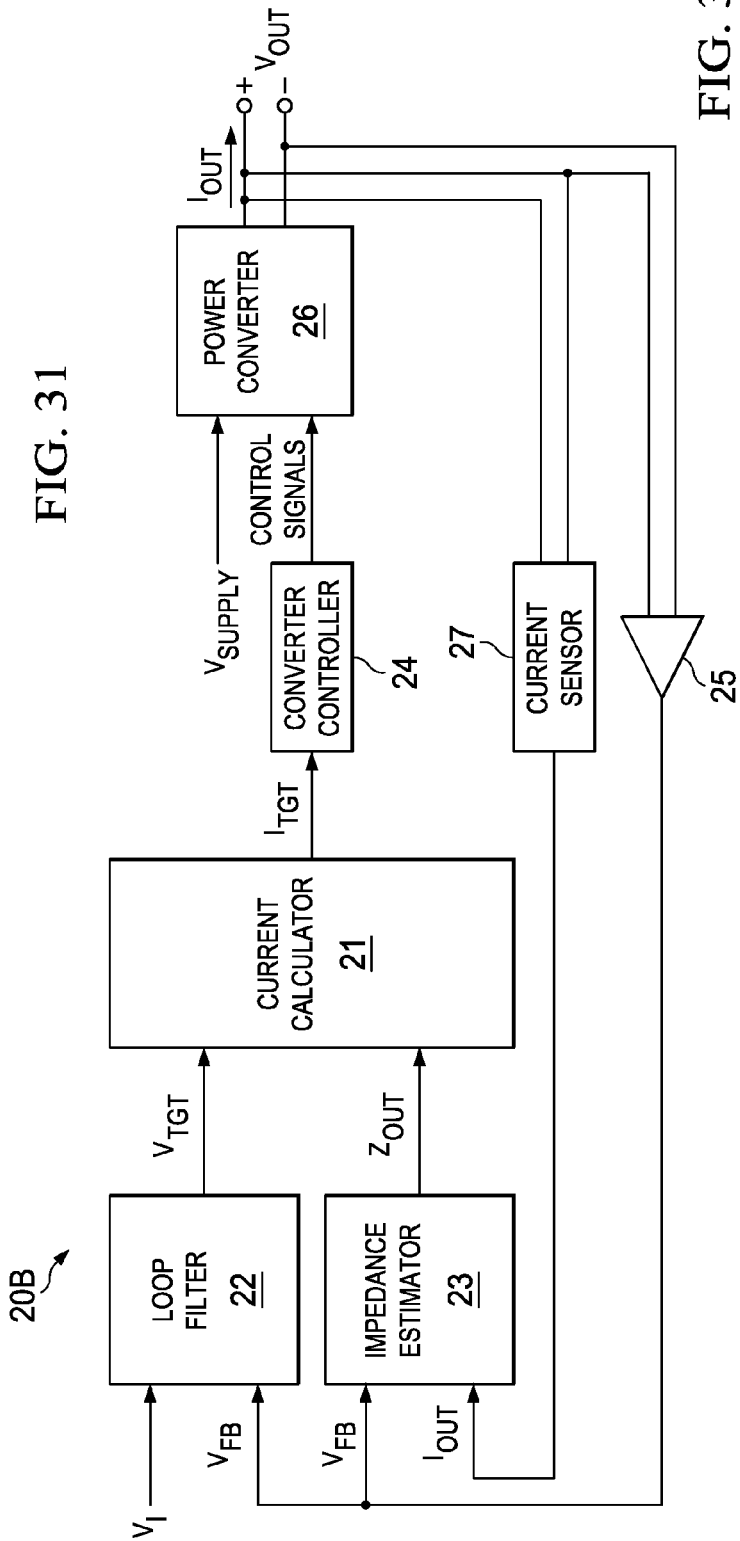
FIG. 32 illustrates a block and circuit diagram of selected components of an example switched mode amplifier including an impedance estimator, in accordance with embodiments of the present disclosure.

FIG. 32 illustrates a block and circuit diagram of selected components of an example switched mode amplifier 20B including an impedance estimator 23, in accordance with embodiments of the present disclosure. In the embodiments represented by FIG. 32, switched mode amplifier 20B may operate as voltage feedback loop (e.g., a delta-sigma modulator) responsive to input voltage $V_I$ and output voltage $V_{OUT}$. Switched mode amplifier 20B may be similar to switched mode amplifier 20 of FIG. 4, except that switched mode amplifier 20B may also include impedance estimator 23 and a current calculator 21 interfaced between loop filter 22 and converter controller 24, and a differential amplifier 25 and a current sensor 27. Loop filter 22, converter controller 24, and power converter 26 may respectively comprise any suitable loop filters, converter controllers, and power converters, including without limitation the various loop filters, converter controllers, and power converters disclosed herein. In the embodiments represented by FIG. 32, loop filter 22 may receive an input voltage $V_I$ as its input and generate, based on input voltage $V_I$ and an analog voltage feedback signal $V_{FB}$, a target voltage signal $V_{TGT}$ representative of a voltage to be applied as output voltage $V_{OUT}$.

Impedance estimator 23 may comprise any system, device, or apparatus for estimating an impedance of a load at the output of switched mode amplifier 20B (e.g., across the terminals labeled $V_{OUT}$ in FIG. 32). Impedance estimator 23 may estimate load impedance $Z_{OUT}$ based on a measured output current $I_{OUT}$ and analog voltage feedback signal $V_{FB}$ (or other signal indicative of output voltage $V_{OUT}$), and applying Ohm's law to determine load impedance $Z_{OUT}$ (e.g., $Z_{OUT} \approx V_{FB}/I_{OUT}$). In some embodiments, impedance estimator 23 may comprise or implement an adaptive filter (e.g., a least-mean-squares filter) configured to adaptively minimize a difference between target output voltage $V_{TGT}$ of a load and an actual output voltage of the load (e.g., $V_{OUT}$, $V_{FB}$), wherein target output voltage $V_{TGT}$ is equal to an output voltage expected from applying target current signal $I_{TGT}$ to the load assuming no variance of a nominal impedance of the load, and the actual output voltage at the load is the output voltage of the load generated by applying the output current (e.g., $I_{OUT}$) to the load. In these and other embodiments, impedance estimator 23 may be configured to determine impedance of a load at the output of switched-mode amplifier 20B as a function of a frequency of output voltage $V_{OUT}$ and control target current signal $I_{TGT}$ to compensate for variance of the impedance as a function of the frequency. In these and other embodiments, impedance estimator 23 may be configured to control target current signal $I_{TGT}$ to compensate for variance of the impedance $Z_{OUT}$ over time.

Current calculator 21 comprise any system, device, or apparatus for calculating a target current $I_{TGT}$ to be applied to the output load of power converter 26 based on target output voltage $V_{TGT}$ generated by loop filter 22 and estimated load impedance $Z_{OUT}$ generated by impedance estimator 23, and applying Ohm's law to determine target current $I_{TGT}$ (e.g., $I_{TGT} \approx V_{TGT}/Z_{OUT}$).

Differential amplifier 25 may comprise any system, device, or apparatus configured to receive at its input terminals differential output voltage $V_{OUT}$ and generate analog voltage feedback signal $V_{FB}$ indicative of differential output voltage $V_{OUT}$.

Current sensor 27 may comprise any system, device, or apparatus configured to sense output current $I_{OUT}$ and generate a signal indicative of such sensed output current.

Thus, switched-mode amplifier 20B may comprise a system which includes an impedance estimator 23 configured to estimate an impedance of a load at the output of switched-mode amplifier 20B and a current calculator 21 configured to generate a target current $I_{TGT}$ based at least on an input voltage $V_I$ and the impedance. In some embodiments, current calculator 21 may be integral to impedance estimator 23 such that impedance estimator 23 includes both the functionality of impedance estimator 23 and current calculator 21 depicted on FIG. 32. Such system may also include a voltage feedback loop (e.g., implemented by differential amplifier 25 and loop filter 22) responsive to a difference between the input voltage $V_I$ and an output voltage of the load (represented by analog voltage feedback signal $V_{FB}$). Such system may also include a current controller (e.g., implemented by converter controller 24 and power converter 26) configured to, responsive to the voltage feedback loop, impedance estimator 23, and the input voltage $V_I$, generate an output current $I_{OUT}$ to the load.

As used herein, absolute voltage values (e.g., 1V, 3V, 7V, 14V) are given merely as examples, and any other suitable voltages may be used to define ranges of operation of the various power converter modes described herein.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A power stage for producing an output voltage to a load, comprising:
   a power converter comprising:
      a power inductor;
      a plurality of switches arranged to sequentially operate in a plurality of switch configurations; and
      an output for producing the output voltage comprising a first output terminal and a second output terminal, wherein a first switch of the plurality of switches is coupled to the first output terminal and a second switch of the plurality of switches is coupled to the second output terminal;
   a linear amplifier coupled to the output; and
   a controller configured to:
      in a first mode of operation of the power stage, enable the linear amplifier to transfer electrical energy from an input source of the power stage to the load and disable the plurality of switches from transferring electrical energy from the input source to the load; and
      in a second mode of operation of the power stage, sequentially enable the linear amplifier in accordance with a probability which is a function of the output voltage to transfer electrical energy from the input source of the power stage to the load and sequentially apply switch configurations from the plurality of switch configurations to selectively activate or deactivate each of the plurality of switches in order to transfer electrical energy from the input source of the power stage to the load.

2. The power stage of claim 1, wherein the controller is configured to operate the power stage in the first mode of operation when a magnitude of the output voltage is below a threshold voltage and operate the power stage in the second mode of operation when the magnitude of the output voltage is above the threshold voltage.

3. The power stage of claim 1, wherein the controller is further configured to, in a third mode of operation of the power stage, disable the linear amplifier from transferring electrical energy from an input source of the power stage to the load and sequentially apply switch configurations from the plurality of switch configurations to selectively activate or deactivate each of the plurality of switches in order to transfer electrical energy from the input source of the power stage to the load.

4. The power stage of claim 3, wherein the controller is configured to operate the power stage in the first mode of operation when a magnitude of the output voltage is below a first threshold voltage, operate the power stage in the second mode of operation when the magnitude of the output voltage is above the first threshold voltage and below a second threshold voltage, and operate the power stage in a third mode of operation when the magnitude of the output voltage is above the third threshold voltage.

5. The power stage of claim 1, wherein the linear amplifier comprises a quadrant digital-to-analog converter.

6. The power stage of claim 1, wherein the linear amplifier comprises a hemispherical digital-to-analog converter.

7. A power stage for producing an output voltage to a load, comprising:
   a power converter comprising:
      a power inductor;
      a plurality of switches arranged to sequentially operate in a plurality of switch configurations; and
      an output for producing the output voltage comprising a first output terminal and a second output terminal, wherein a first switch of the plurality of switches is coupled to the first output terminal and a second switch of the plurality of switches is coupled to the second output terminal;
   a linear amplifier coupled to the output; and
   a controller configured to:
      control the linear amplifier to transfer electrical energy from an input source of the power stage to the load in accordance with one or more least significant bits of a digital input signal; and
      control the power converter in accordance with bits of the digital input signal other than the one or more least significant bits to sequentially apply switch configurations from the plurality of switch configurations to selectively activate or deactivate each of the plurality of switches in order to transfer electrical energy from the input source of the power stage to the load.

8. The power stage of claim 7, wherein the linear amplifier comprises a quadrant digital-to-analog converter.

9. The power stage of claim 7, wherein the linear amplifier comprises a hemispherical digital-to-analog converter.

10. A method for producing an output voltage to a load, comprising:
    in a power stage comprising power converter having a power inductor, a plurality of switches arranged to sequentially operate in a plurality of switch configurations, and an output for producing the output voltage comprising a first output terminal and a second output terminal, wherein a first switch of the plurality of switches is coupled to the first output terminal and a second switch of the plurality of switches is coupled to the second output terminal:
       in a first mode of operation of the power stage, enable a linear amplifier to transfer electrical energy from an input source of the power stage to the load and disable the plurality of switches from transferring electrical energy from the input source to the load; and
       in a second mode of operation of the power stage, sequentially enable the linear amplifier in accordance with a probability which is a function of the output voltage to transfer electrical energy from the input source of the power stage to the load and sequentially apply switch configurations from the plurality of switch configurations to selectively activate or deactivate each of the plurality of switches in order to transfer electrical energy from the input source of the power stage to the load.

11. The method of claim 10, further comprising operating the power stage in the first mode of operation when a magnitude of the output voltage is below a threshold voltage and operating the power stage in the second mode of operation when the magnitude of the output voltage is above the threshold voltage.

12. The method of claim 10, further comprising, in a third mode of operation of the power stage, disable the linear amplifier from transferring electrical energy from an input source of the power stage to the load and sequentially apply switch configurations from the plurality of switch configurations to selectively activate or deactivate each of the plurality of switches in order to transfer electrical energy from the input source of the power stage to the load.

13. The method of claim 12, further comprising operating the power stage in the first mode of operation when a magnitude of the output voltage is below a first threshold voltage, operating the power stage in the second mode of operation when the magnitude of the output voltage is above the first threshold voltage and below a second threshold voltage, and operating the power stage in the third mode of operation when the magnitude of the output voltage is above the third threshold voltage.

14. The method of claim 10, wherein the linear amplifier comprises a quadrant digital-to-analog converter.

15. The method of claim 10, wherein the linear amplifier comprises a hemispherical digital-to-analog converter.

16. A method for producing an output voltage to a load, comprising:
in a power stage comprising power converter having a power inductor, a plurality of switches arranged to sequentially operate in a plurality of switch configurations, and an output for producing the output voltage comprising a first output terminal and a second output terminal, wherein a first switch of the plurality of switches is coupled to the first output terminal and a second switch of the plurality of switches is coupled to the second output terminal:
controlling a linear amplifier to transfer electrical energy from an input source of the power stage to the load in accordance with one or more least significant bits of a digital input signal; and
controlling the power converter in accordance with bits of the digital input signal other than the one or more least significant bits to sequentially apply switch configurations from the plurality of switch configurations to selectively activate or deactivate each of the plurality of switches in order to transfer electrical energy from the input source of the power stage to the load.

17. The method of claim 16, wherein the linear amplifier comprises a quadrant digital-to-analog converter.

18. The method of claim 16, wherein the linear amplifier comprises a hemispherical digital-to-analog converter.

\* \* \* \* \*